(12) United States Patent
Hayakawa

(10) Patent No.: US 7,772,052 B2
(45) Date of Patent: Aug. 10, 2010

(54) METHOD OF MANUFACTURING SEMICONDUCTOR DEVICE

(75) Inventor: Shigenori Hayakawa, Atsugi (JP)

(73) Assignee: Semiconductor Energy Laboratory Co., Ltd, Atsugi-shi, Kanagawa-ken (JP)

(*) Notice: Subject to any disclaimer, the term of this patent is extended or adjusted under 35 U.S.C. 154(b) by 133 days.

(21) Appl. No.: 10/983,584

(22) Filed: Nov. 9, 2004

(65) Prior Publication Data

US 2005/0064685 A1    Mar. 24, 2005

Related U.S. Application Data

(62) Division of application No. 10/119,318, filed on Apr. 10, 2002, now Pat. No. 6,833,313.

(30) Foreign Application Priority Data

Apr. 13, 2001  (JP) ............................. 2001-116208

(51) Int. Cl.
*H01L 21/00*  (2006.01)
(52) U.S. Cl. ........................................ 438/151; 438/514
(58) Field of Classification Search ................ 438/514, 438/149, 151, 15; 257/E21.147
See application file for complete search history.

(56) References Cited

U.S. PATENT DOCUMENTS

| 4,689,667 | A | * | 8/1987 | Aronowitz | .................. 257/607 |
|---|---|---|---|---|---|
| 5,372,958 | A | * | 12/1994 | Miyasaka et al. | ........... 438/486 |
| 5,763,904 | A | * | 6/1998 | Nakajima et al. | ............. 257/66 |
| 6,368,517 | B1 | * | 4/2002 | Hwang et al. | .................. 216/67 |
| 6,403,411 | B1 | * | 6/2002 | Chu et al. | .................... 438/238 |
| 6,706,544 | B2 | * | 3/2004 | Yamazaki et al. | ............. 438/30 |
| 7,023,021 | B2 | | 4/2006 | Yamazaki et al. | |
| 2002/0119585 | A1 | * | 8/2002 | Yamazaki et al. | ............. 438/29 |
| 2002/0140023 | A1 | * | 10/2002 | Ohba et al. | .................. 257/315 |
| 2005/0181608 | A1 | * | 8/2005 | Stoeher et al. | .............. 438/689 |
| 2009/0051270 | A1 | * | 2/2009 | Yamazaki | .................... 313/503 |

FOREIGN PATENT DOCUMENTS

| GB | 2 230 335 | 6/1998 |
|---|---|---|
| JP | 08-228005 | 9/1996 |
| JP | 09-237899 | 9/1997 |
| JP | 10-012890 | 1/1998 |
| JP | 10-135182 | 5/1998 |

* cited by examiner

*Primary Examiner*—Bradley K Smith
(74) *Attorney, Agent, or Firm*—Eric J. Robinson, Robinson Intellectual Property Law Office, P.C.

(57) ABSTRACT

There is provided a method of manufacturing a semiconductor device, in which removal of the resist after ion implantation becomes easy. In order to solve the above problem, the manufacturing method includes a step of removing a resist mask after a step of implanting an ion of a rare gas element. Also, another manufacturing method includes a first step of implanting an ion of an impurity element for imparting a conductivity type, a second step of implanting an ion of a rare gas element, and a third step of removing a resist mask after the first step and the second step.

20 Claims, 17 Drawing Sheets

Resist

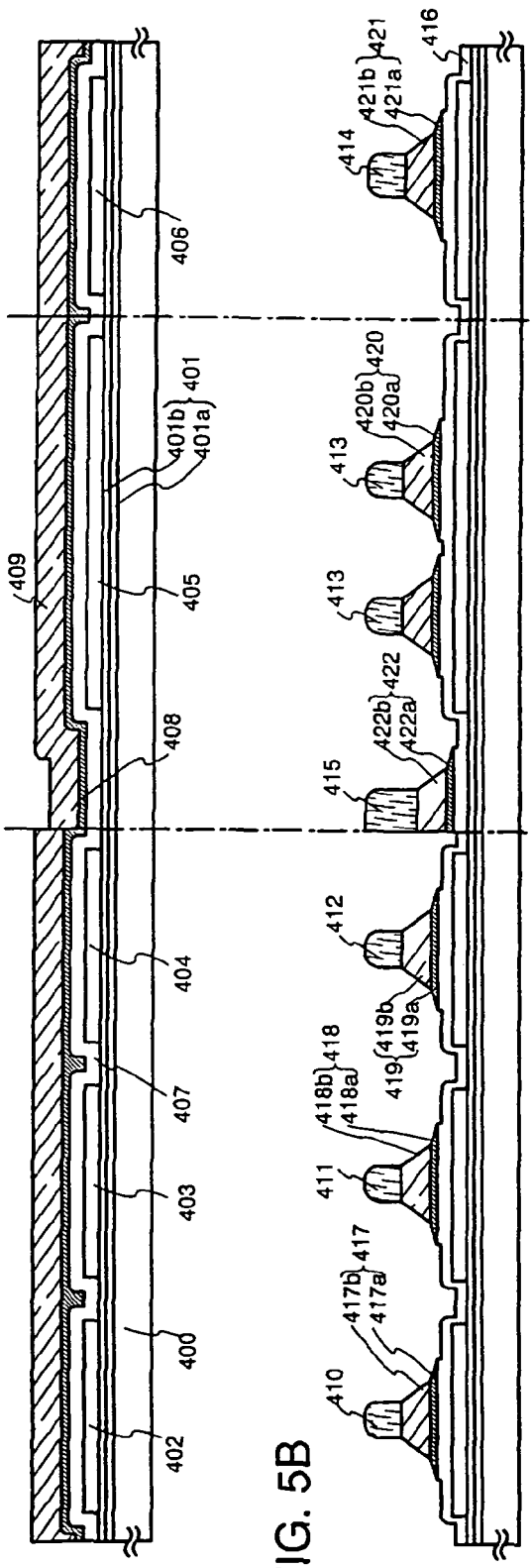
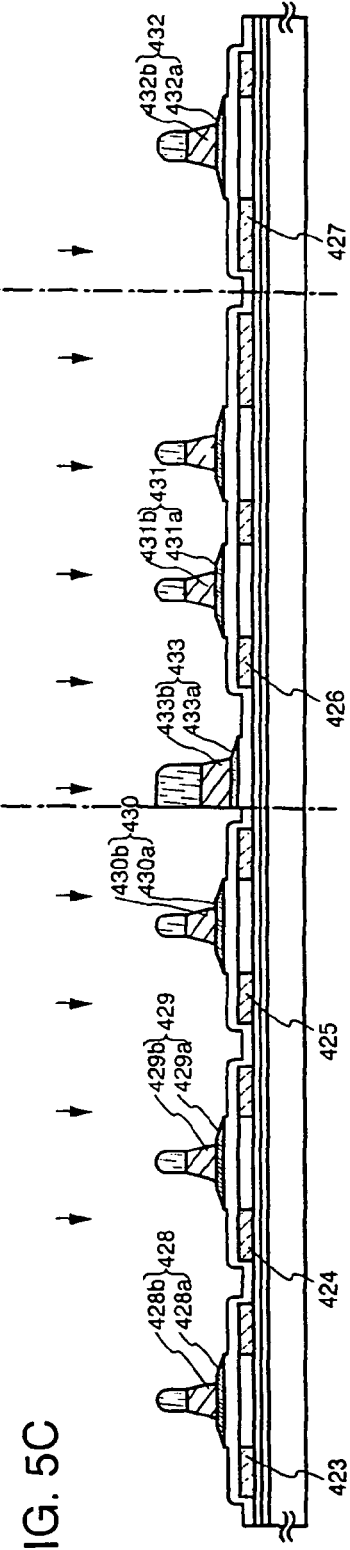

METHOD OF MANUFACTURING SEMICONDUCTOR DEVICE

BACKGROUND OF THE INVENTION

1. Field of the Invention

The present invention relates to a method of manufacturing a semiconductor device using ion implantation, and more specifically, to an ion implantation method using a resist mask and a method of removing the resist mask. Note that the ion implantation in the present invention indicates ion beam irradiation and includes both ion beam irradiation with mass separation and ion beam irradiation without mass separation.

2. Description of the Related Art

In steps of manufacturing a semiconductor element, introduction (doping) of an impurity element to semiconductor by ion implantation is performed for valence electron control. An ion implantation method is roughly described as a method of dissociating a gas including an element belonging to group 13 or group 15 of the periodic table, such as diborane ($B_2H_6$) or phosphine ($PH_3$), to ionize it and accelerating the ion by an electric field to physically implant it into a substrate on which a semiconductor element is formed. With respect to ionic species produced at this time, it is known that plural species are produced when they are classified by mass number. A method of mass-separating these ions and implanting a single ion is generally called the ion implantation method. Also, a method of implanting an ion without particularly performing mass separation is called an ion dope method, a plasma dope method, or the like.

In all cases, it is necessary to selectively implant an ion into a predetermined region of a semiconductor to form an impurity region. Thus, a method of forming a resist pattern in advance to use it as a mask is used. Hereinafter, ion implantation using a resist as a mask and removal of the resist used as the mask will be described.

FIG. 4 shows a step of forming source and drain regions of TFTs of a CMOS structure. Since it is necessary to selectively introduce phosphorus (P) into source and drain regions 105 of an n-channel TFT 111, a p-channel TFT 110 is masked by a resist 107. When ion implantation is performed with this state, an ion including P is implanted into the source and drain regions 105 of the n-channel TFT 111 through a gate insulating film 102 using a gate electrode 101 as a mask.

Subsequently, the process advances to a step of removing the resist 107 as the mask. A method of removing the resist using a special stripper or a method of ashing (etching) the resist by supplying an oxygen radical is generally used. An ashing step is performed using high frequency (RF) plasma with parallel flat plates, high density plasma process with inductive coupled plasma (ICP), microwave excitation plasma, or the like.

However, there is a problem that the resist cannot be easily removed in the step of removing the resist. In ion implantation, since an ion is accelerated by a high electric field to implant it into a substrate, when ion collision is caused, the kinetic energy is converted into heat energy to heat the substrate and objects formed thereon. Although the heated temperature depends on an ion implantation condition, it is known that the temperature can rise up to about 200° C.

In contrast to this, only baking process at about 100° C. to 140° C. is performed for the resist formed as the mask. Thus, when the resist is substantially heated at a temperature higher than that temperature, a chemical change such that the surface thereof is altered and cured is produced. Generally, the thus altered resist cannot be removed even by using the special stripper. Thus, ashing having a stronger removal effect is generally used.

Further, when a P ion is implanted, P reacts with a novolac resin as a resist material so that an altered layer in which a structure is changed is produced. Since the altered layer is chemically stable, it cannot be easily removed by a conventional stripper or a conventional ashing method. When a dose of P is large, such a tendency becomes remarkable. Thus, ashing process for a very long time is required. Also, since the resist cannot be completely removed by only ashing process, there is a case where a residue thereof is produced, causing inconvenience in later steps.

SUMMARY OF THE INVENTION

The present invention has been made in view of the above, and an object of the present invention is to provide a method of manufacturing a semiconductor device, in which removal of the resist after ion implantation becomes easy.

In order to attain the above-mentioned object, the present invention is characterized by comprising the steps of simultaneously implanting an ion of an impurity element having a conductivity type and an ion of a rare gas element and then removing a resist mask.

Further, the present invention is characterized by comprising: a first step of implanting an ion of an impurity element having a conductivity type; a second step of implanting an ion of a rare gas element; and a third step of removing a resist mask after the first step and the second step.

Further, the present invention is characterized by comprising: a first step of implanting an ion of an impurity element having a conductivity type; a second step of implanting an ion of a rare gas element; and a third step of removing a resist mask after the first step and the second step have been performed in succession.

Further, the present invention is characterized by comprising the steps of implanting an ion of a rare gas element and then removing a resist mask.

Also, a method of separately performing a first step of implanting an ion of an impurity element having a conductivity type before a resist mask is removed and a second step of implanting an ion of a rare gas element in two stages can be applied. In this case, the second stage (second step) is performed at a lower accelerating voltage than that in the first stage (first step).

Also, a method of performing a step of implanting an ion of an impurity element for imparting a conductivity type and a step of implanting an ion of a rare gas element in succession before a resist mask is removed can be applied.

The rare gas element may be at least one selected from the group consisting of helium, krypton, argon, and xenon.

Also, as the impurity element for imparting a conductivity type, there is P (phosphorus), As (arsenic), B (boron), or the like.

Also, the present invention is characterized by comprising a stage of implanting the ion of the rare gas element before ashing of the resist mask.

A typical example includes using P as the impurity element for imparting a conductivity type and performing Ar ion implantation following P ion implantation. Thus, an ashing rate of the resist can be improved. Also, even when an Ar ion and a P ion are simultaneously implanted, the same effect is obtained.

As described above, it is found that, when the physical action of the ion is applied to the altered layer in the surface of the resist, which is produced in the ion dope step, ashing of the resist mask in which the altered layer is formed can be easily performed due to a reason such that severing of a bond for which chemical decomposition is usually difficult becomes possible or the altered layer is chipped away by the impact of ion implantation. In all cases, in the ion implantation step of adding an impurity element having one conductivity type to a semiconductor, a resist pattern is used as a mask and an ion of an rare gas element is implanted simultaneous with an ion of the impurity element having one conductivity type or implanted after implantation of the ion of the impurity element having one conductivity type. Thus, ashing process of removing the resist pattern can be easily performed.

BRIEF DESCRIPTION OF THE DRAWINGS

In the accompanying drawings:

FIGS. 5A to 5C are cross sectional views for explaining steps of manufacturing TFTs;

DETAILED DESCRIPTION OF THE PREFERRED EMBODIMENTS

Hereinafter, embodiment modes of the present invention will be described using the accompanying drawings.

Embodiment Mode 1

Figure 1:
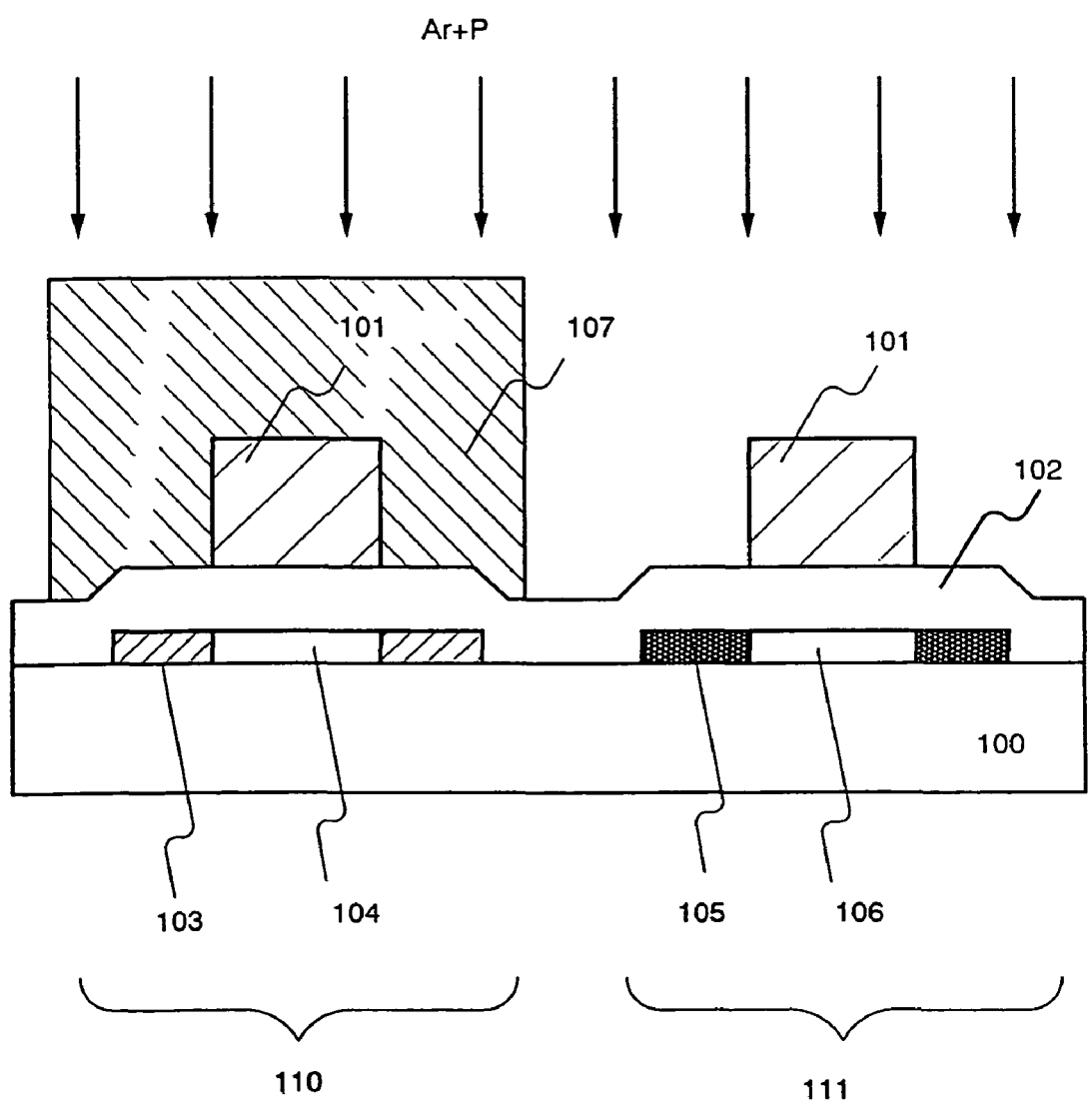
FIG. 1 shows an ion implantation step according to the present invention.

FIG. 1 shows a step of forming impurity regions corresponding to source and drain regions of an n-channel TFT and a p-channel TFT of a CMOS structure, which are produced on a substrate 100. In order to selectively introduce phosphorus (P) into source and drain regions 105 in a semiconductor layer 106 of an n-channel TFT 111, a semiconductor layer 104 (including source and drain regions 103) of a p-channel TFT 110 is masked by a resist 107. The resist is obtained by forming a resin including a novolac system resin at a thickness of 1 μm, and is patterned in a predetermined pattern using a photolithography. Then, P ion implantation is performed. An ion including P is implanted into the source and drain regions 105 through a gate insulating film 102 using a gate electrode 101 as a mask.

The implantation of P is performed using $PH_3$ by an ion implantation method or an ion dope method. At this time, $PH_3$ diluted with a rare gas such as Ar may be used and an ion of the rare gas may be simultaneously implanted. Alternatively, $PH_3$ diluted with hydrogen may be used and an ion of the rare gas may be implanted thereafter.

As described above, when the ion of the rare gas is implanted, the step of removing by ashing the resist mask in which an altered layer is formed in the surface thereof becomes easy.

Subsequently, the process advances to a step of removing the resist mask 107. Here, the resist mask is ashed by supplying an oxygen radical. An ashing method is not particularly limited. RF plasma with parallel flat plates, high-density plasma process with ICP (inductive coupled plasma), microwave excitation plasma, or the like can be applied. Since the rare gas ion is implanted, the resist mask can be removed with relative ease.

Figure 2A:
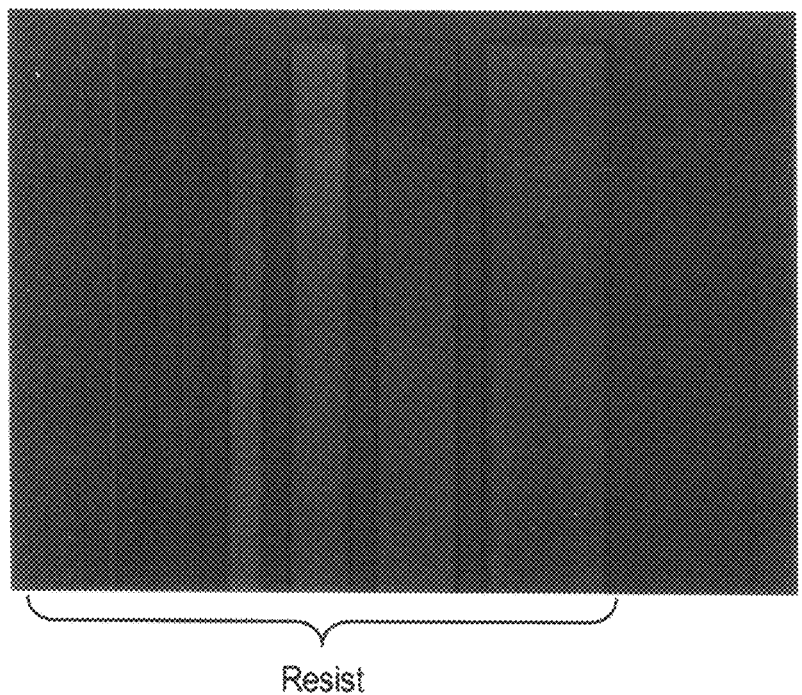
FIGS. 2A and 2B are optical microscope photographs indicating a state of a resist after ashing.
Figure 2B:
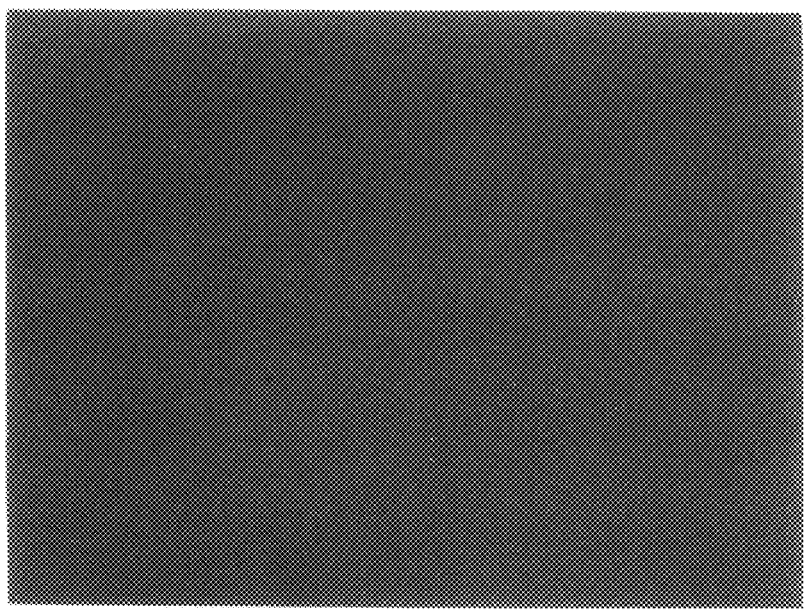

FIGS. 2A and 2B are photographs obtained by using an optical microscope, to observe a state of the resist mask after ashing. Those are surface observation photographs with a magnification of 100 times by an optical microscope. FIG. 2A indicates case where only P ion implantation is performed and FIG. 2B indicates a case where Ar ion implantation is performed in addition to the P ion implantation. Here, ashing is conducted using a microwave for 160 minutes. In the P ion implantation, ion species including P are implanted at an accelerating voltage of 80 kV and a dose of $5 \times 10^{15}/cm^2$. The Ar ion implantation is performed at an accelerating voltage of 80 kV and a dose of $5 \times 10^{15}/cm^2$. An ion doping apparatus is used for ion implantation. As shown in FIG. 2A, the resist is left in the sample in which only the P ion implantation is performed. On the other hand, as shown in FIG. 2B, it can be observed that the resist is almost removed completely in the case where the P ion implantation and the Ar ion implantation are performed.

Figure 3A:
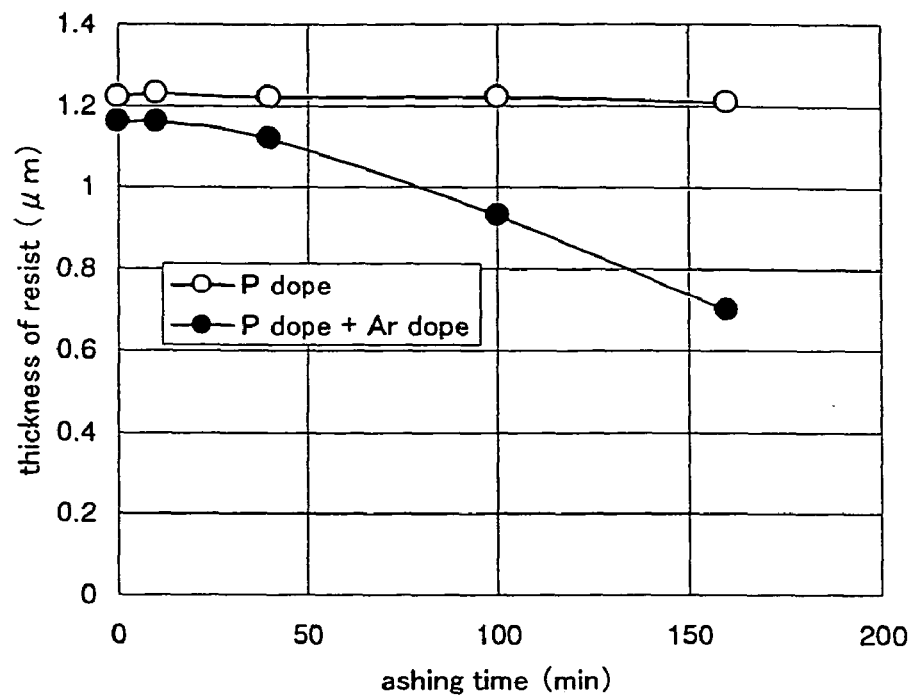
FIGS. 3A and 3B are graphs indicating change of a resist film thickness according to an ashing time and its dependence on ion implantation conditions.

FIG. 3A shows a time variation in a film thickness of the resist. In the case of the sample for which only the P ion implantation is performed, even if an ashing time is prolonged, there is almost no change in the film thickness. On the other hand, in the case of the sample for which the Ar ion implantation is additionally performed, a reduction in a film thickness is observed, indicating that ashing is progressed. Also, when the ashing time is 0, it is clear that a film thickness of the resist in the sample for which the Ar ion implantation is additionally performed is reduced. It is considered that this is because the surface of the resist is sputtered by the Ar ion implantation.

Here, one example using Ar is indicated. However, in addition to this, if an element which does not chemically react with the resist is used, the same effect is obtained. In particular, a rare gas such as Ne, Kr, or Xe is desirable. This can be applied to not only the P ion implantation but also an ion implantation step of implanting another ion for imparting a conductivity type to a semiconductor.

Figure 3B:
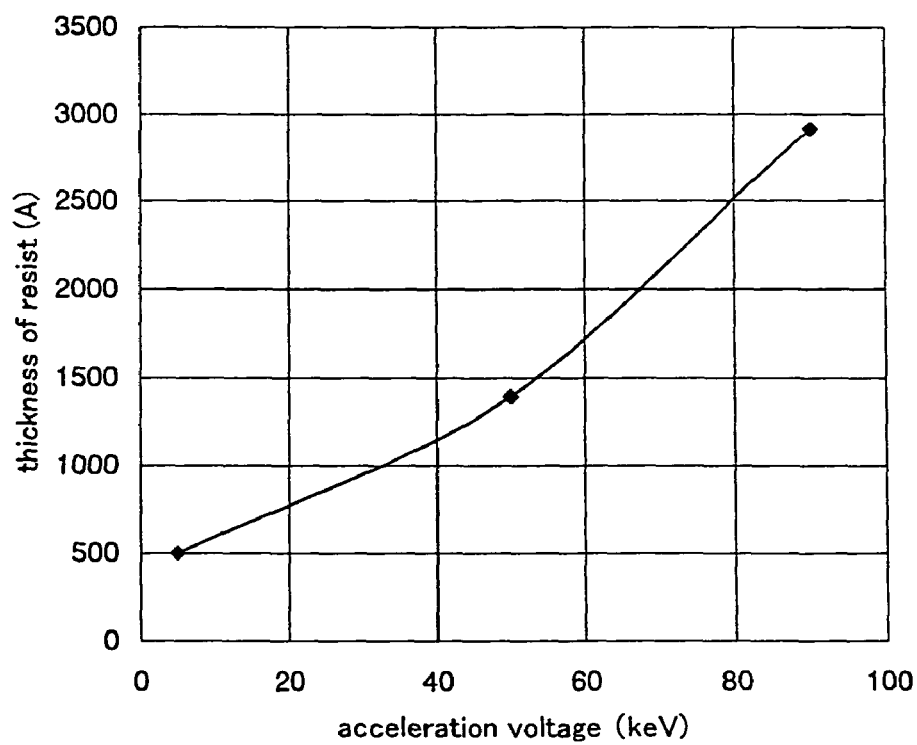
Figure 4:
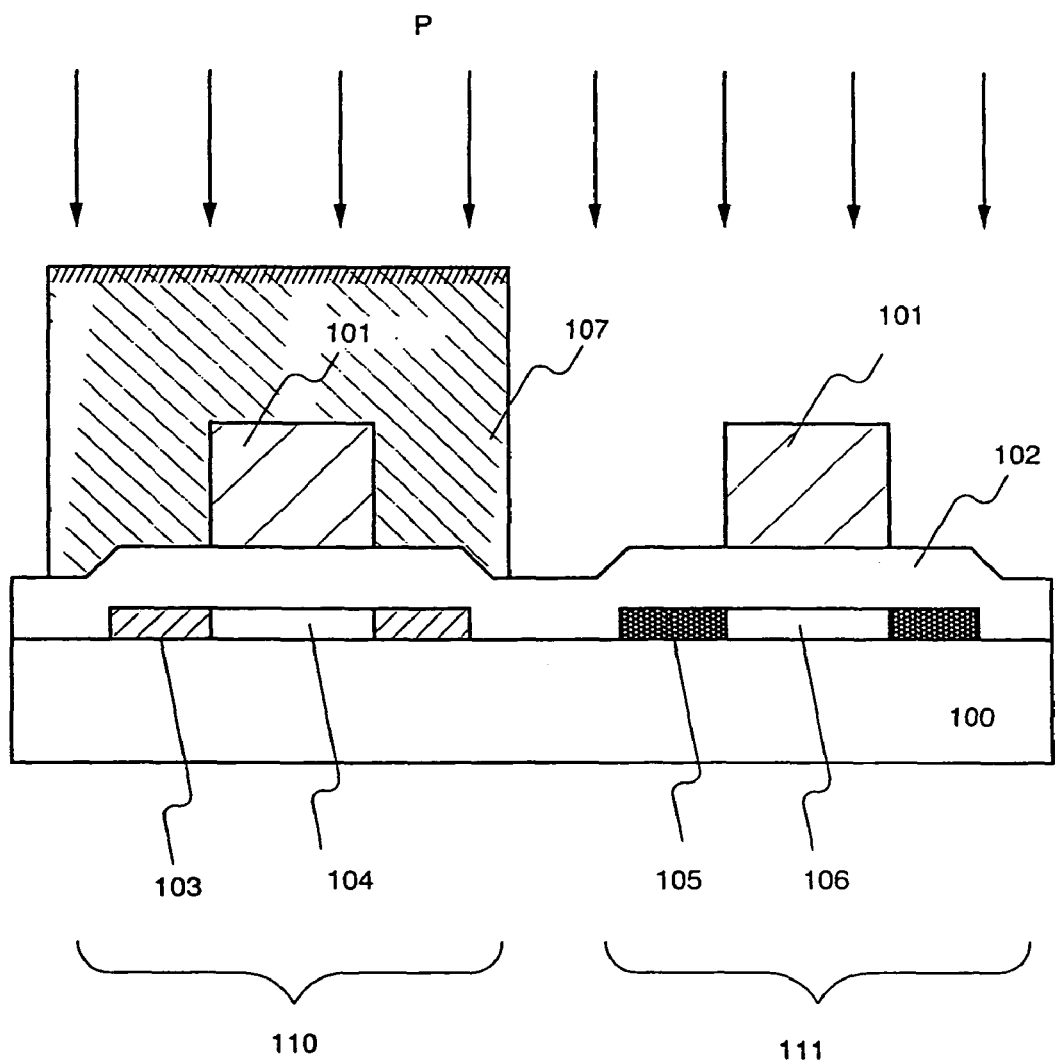
FIG. 4 shows an ion implantation step according to a conventional technique.

Also, when the ion implantation of an element for imparting a conductivity type to a semiconductor (first ion implantation), is followed by the ion implantation of a rare gas element, a more preferable result is obtained in the case where the ion implantation of a rare gas element (second ion implantation) is performed at a lower accelerating voltage than that in the first ion implantation. FIG. 3B shows a result in this case. This indicates a change in a remaining film thickness after resists for which Ar implantation is performed at different accelerating voltages are ashed for a predetermined time. It is apparent that ashing progresses more remarkably with a low accelerating voltage. When an accelerating voltage is 10 keV to 100 keV, it is generally considered that a sputtering rate is higher and thus an effect of removing the altered resist is greater when the accelerating voltage is lower.

Thus, when an ion of the rare gas is implanted simultaneous with implanting an ion of the impurity element for imparting a conductivity type or implanted after implantation of the ion of the impurity element, the resist used as a mask at doping can be easily removed.

Embodiment Mode 2

In this embodiment mode, four kinds of samples indicated below are prepared and ashing rates are measured. With respect to the respective samples, first, a resist having a film thickness of 1.4 μm is formed on a glass substrate. Then, the sample (1) into which only a P ion is implanted, the sample (2) into which a P ion and an Ar ion are implanted (Ar ion implantation condition: an accelerating voltage of 30 keV and a dose of $5 \times 10^{15}/cm^2$), the sample (3) into which a P ion and an Ar ion are implanted (Ar ion implantation condition: an accelerating voltage of 30 keV and a dose of $1 \times 10^{16}/cm^2$), and the sample (4) for which no ion implantation is performed are prepared. Note that, with respect to a P ion implantation condition for the samples (1) to (3), an accelerating voltage is 80 keV, a dose is $5.0 \times 10^{15}/cm^2$, and in the samples (2) and (3) Ar ion implantation is performed after P ion implantation.

Note that resist film thicknesses of the respective samples produced by ion implantation process are 1.26 μm in the sample (1), 1.18 μm in the sample (2), and 1.24 μm in the sample (3). With respect to the sample (4), since the ion implantation process is not performed, the film thickness is not changed.

Such samples are ashed by an ICP (inductive coupled plasma) method at 1800 W, 66.5 Pa, and 300 sccm as a flow rate of $H_2O$, and film thicknesses of the resists after 30 seconds, 45 seconds, and 65 seconds are measured to thereby measure ashing rates.

Figure 12:
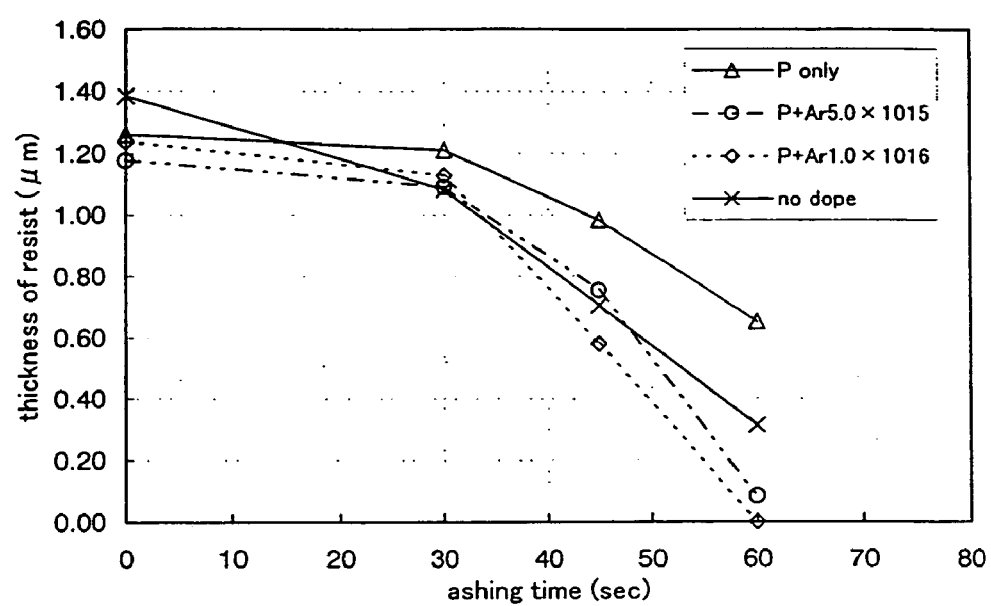
FIG. 12 shows a result obtained by measuring an etching rate of a resist.

Table 1 indicates measured values of film thicknesses of the respective samples. FIG. 12 shows a result obtained by graphing the measured values.

TABLE 1

| Ashing time (sec) | (1) only P (μm) | (2) P + Ar ($5 \times 10^{15}$) (μm) | (3) P + Ar ($5 \times 10^{16}$) (μm) | (4) no dope (μm) |
|---|---|---|---|---|
| 0 | 1.26 | 1.18 | 1.24 | 1.38 |
| 30 | 1.21 | 1.09 | 1.13 | 1.08 |
| 45 | 0.98 | 0.75 | 0.58 | 0.70 |
| 60 | 0.65 | 0.08 | 0.00 | 0.31 |

Note that there is a technique in which a surface cured layer of a resist produced by ion implantation at a high dose is removed by ion impact process to thereby perform ashing. However, according to the result shown in FIG. 12, it is hard to consider that the surface cured layer is removed by ion implantation of an Ar ion in the present invention. Since almost no change is observed for the film thickness of the resist until 30 seconds after the start of ashing, it is considered that an altered layer (cured layer) in the surface is not removed even when the ion implantation of the Ar ion is performed.

When the ashing process is continued, the film thickness in the sample (2) is reduced from 1.09 μm to 0.75 μm and the film thickness in the sample (3) is reduced from 1.13 μm to 0.58 μm. Also, it is apparent from a gradient of the graph shown in FIG. 12 that the ashing rate is greatly improved. On the other hand, the film thickness in the sample (1) to which only P is added is reduced from 1.21 μm to 0.98 μm and the film thickness in the sample (4) to which no element is added is reduced from 1.08 μm to 0.70 μm, indicating that a change in a film thickness is small. It is also apparent from FIG. 12 that the ashing rate is not greatly changed.

Thus, when the present invention is applied, it is apparent that the ashing rate of the resist is significantly improved after the altered layer (cured layer) in the surface of the resist is removed and removal of the resist after ion implantation becomes easy.

Embodiments

Embodiment 1

In this embodiment, a method of manufacturing an active matrix substrate for a reflection liquid crystal display device will be described using FIGS. 5A to FIG. 9. In this specification, a substrate on which a driver circuit, a CMOS circuit and a pixel portion having a pixel TFT and a storage capacitor are formed is called an active matrix substrate for convenience of description.

First, a substrate 400 made of glass such as barium borosilicate glass (represented by #7059 glass, #1737 glass, or the like, which is produced by Corning Corporation) or aluminoborosilicate glass is used. A quartz substrate or a silicon substrate may also be used as the substrate 400. Also, a substrate obtained by forming an insulating film on the surface of a metallic substrate or a stainless steel substrate may be used.

Next, a base film 401 made from an insulating film such as a silicon oxide film, a silicon nitride film, or a silicon oxynitride film is formed on the substrate 400. In this embodiment, a two-layer structure is used for the base film 401. However, a single layer of the insulating film or a structure in which two or more such layers are laminated may also be used. As a first layer of the base film 401, a silicon oxynitride film 401a is formed at a thickness of 10 nm to 200 nm (preferably, 50 nm to 100 nm) by a plasma CVD method using $SiH_4$, $NH_3$, and $N_2O$ as reactive gases. In this embodiment, the silicon oxynitride film 401a (composition ratio: Si=32%, O=27%, N=24%, and H=17%) having a film thickness of 50 nm is formed. As a second layer of the base film 401, a silicon oxynitride film 401b is laminated at a thickness of 50 nm to 200 nm (preferably, 100 nm to 150 nm) by a plasma CVD method using $SiH_4$ and $N_2O$ as reactive gases. In this embodiment, the silicon oxynitride film 401b (composition ratio: Si=32%, O=59%, N=7%, and H=2%) having a film thickness of 100 nm is formed.

Then, semiconductor layers 402 to 406 are formed on the base film. The semiconductor layers 402 to 406 are formed as follows. That is, a semiconductor film is formed at a thickness of 25 nm to 80 nm (preferably, 30 nm to 60 nm) by a known means (such as a sputtering method, an LPCVD method, or a plasma CVD method) and a known crystallization method (such as a laser crystallization method, a thermal crystallization method using RTA and a furnace anneal, or a thermal crystallization method using a metallic element for promoting crystallization) is performed to crystalline the semiconductor film. After that, the obtained crystalline semiconductor film is patterned in a predetermined shape to form the semiconductor layers 402 to 406.

Then, a gate insulating film 407 covering the semiconductor layers 402 to 406 is formed. The gate insulating film 407 is formed using an insulating film containing silicon at a thickness of 40 nm to 150 nm by a plasma CVD method or a sputtering method. In this embodiment, a silicon oxynitride film (composition ratio: Si=32%, O=59%, N=7%, and H=2%) is formed at a thickness of 110 nm by the plasma CVD method. Of course, the gate insulating film is not limited to the silicon oxynitride film and thus another insulating film containing silicon may be used as a single layer or a laminate structure.

Then, a first conductive film 408 having a film thickness of 20 nm to 100 nm and a second conductive film 409 having a film thickness of 100 nm to 400 nm are laminated on the gate insulating film 407. In this embodiment, the first conductive film 408 made from a tantalum nitride (TaN) film having a film thickness of 30 nm and the second conductive film 409 made from a tungsten (W) film having a film thickness of 370 nm are laminated.

Next, masks 410 to 415 made of resists are formed by a photolithography method and first etching process for forming electrodes and wirings is performed. The first etching process is performed under a first etching condition and a second etching condition (FIG. 5B). In this embodiment, as the first etching condition, an ICP etching method is used. Also, $CF_4$, $Cl_2$, and $O_2$ are used as etching gases and a ratio of respective gas flow rates is set to be 25:25:10. RF power of 500 W and 13.56 MHz is supplied to a coil type electrode at a pressure of 1 Pa to produce plasma for effecting the etching. Also, RF power of 150 W and 13.56 MHz is supplied to a substrate side (sample stage) to apply a substantially negative self-bias voltage. The W film is etched under this first etching condition so that end portions of the first conductive layer become tapered.

After that, the etching condition is changed to the second etching condition without removing the masks 410 to 415 made of resists. That is, $CF_4$ and $Cl_2$ are used as etching gases and a ratio of respective gas flow rates is set to be 30:30. RF power of 500 W and 13.56 MHz is supplied to a coil type electrode at a pressure of 1 Pa to produce plasma and etching is performed for about 30 seconds. Also, RF power of 20 W and 13.56 MHz is supplied to a substrate side (sample stage) to apply a substantially negative self-bias voltage. In the second etching condition in which $CF_4$ and $Cl_2$ are mixed, both the W film and TaN film are etched to the same degree. Note that, in order to perform etching without leaving the residue on the gate insulating film, an etching time is preferably increased by about 10% to 20%.

In the above first etching process, when a shape of the mask made of a resist is formed as appropriate, the end portions of the first and second conductive layers become tapered due to an effect of the bias voltage applied to the substrate side. An angle of the taper portions becomes 15° to 45°. Thus, conductive layers 417 to 422 having a first configuration, which are made from the first conductive layers and the second conductive layers (first conductive layers 417a to 422a and second conductive layers 417b to 422b) are formed by the first etching process. Reference numeral 416 denotes a gate insulating film. Regions which are not covered with the conductive layers 417 to 422 having a first configuration are etched by about 20 nm to 50 nm to form thinner regions.

Next, second etching process is performed without removing the masks made of resists (FIG. 5C). Here, $CF_4$, $Cl_2$, and $O_2$ are used as etching gases and the W film is selectively etched. At this time, second conductive layers 428b to 433b are formed on first conductive layers 428a to 433a by the second etching process. On the other hand, almost no etching is performed to the first conductive layers 417a to 422b. Thus, conductive layers 428 to 433 having a second configuration are formed.

Then, first doping process is performed without removing the masks made of resists to add an impurity element for imparting an n-type to the semiconductor layers at a low concentration. As the impurity element for imparting an n-type, an element belonging to group 15 of the periodic table, typically, phosphorus (P) or arsenic (As) is used. Here, phosphorus (P) is used. At this time, implantation of Ar is also performed. The doping process is performed by an ion implantation method. As an ion implantation condition, a dose of P is set to be $1\times10^{13}/cm^2$ to $5\times10^{14}/cm^2$ and an accelerating voltage is set to be 40 keV to 80 keV. A dose of Ar is set to be $1\times10^{13}/cm^2$ to $5\times10^{15}/cm^2$. In this embodiment, a dose of P is set to be $1.5\times10^{13}/cm^2$, a dose of Ar is set to be $1\times10^{14}/cm^2$, and the accelerating voltage is set to be 60 keV. In this case, since the conductive layers 428 to 433 become masks against the impurity element for imparting an n-type, impurity regions 423 to 427 are formed in a self-alignment manner. The impurity element for imparting an n-type is added to the impurity regions 423 to 427 at a concentration range of $1\times10^{18}/cm^3$ to $1\times10^{20}/cm^3$.

Subsequently, the masks made of resists are removed. Ashing using oxygen plasma is used for the removal. Since Ar is implanted simultaneous with P, the altered layer in the resist surface has been removed and thus oxygen plasma ashing can be easily performed. Here, ashing using ICP plasma is performed. Ashing is performed for 60 seconds under the condition of 1800 W, 66.5 Pa, and 300 sccm as a flow rate of $H_2O$.

Subsequently, new masks 434a to 434c made of resists are formed and second doping process is performed at a higher accelerating voltage than that in the first doping process. Ion implantation is performed under a condition of a dose of $1\times10^{13}/cm^2$ to $1\times10^{15}/cm^2$ and an accelerating voltage of 60 keV to 120 keV. The second conductive layers 428b to 432b are used as masks against an impurity element in performing the second doping process such that the impurity element is added to the semiconductor layers under the taper portions of the first conductive layers. Then, third doping process is performed at a lower accelerating voltage than that in the second doping process to obtain a state shown in FIG. 6A. Ion implantation is performed under a condition of a dose of $1\times10^{15}/cm^2$ to $1\times10^{17}/cm^2$ and an accelerating voltage of 50 keV to 100 keV. By the second doping process and the third doping process, an impurity element for imparting an n-type is added to low concentration impurity regions 436, 442, and 448 overlapped with the first conductive layers, at a concentration range of $1\times10^{18}/cm^3$ to $5\times10^{19}/cm^3$ and an impurity element for imparting an n-type is added to high concentration impurity regions 435, 438, 441, 444, and 447 at a concentration range of $1\times10^{19}/cm^3$ to $5\times10^{21}/cm^3$.

Of course, when a suitable accelerating voltage is set, the low concentration impurity regions and the high concentration impurity regions can be formed by one doping process instead of the second doping process and the third doping process.

Subsequently, Ar ion implantation is performed by the same apparatus as in the third doping process in succession. The ion implantation is performed under a condition of a dose of $1\times10^{15}/cm^2$ to $1\times10^{17}/cm^2$ and an accelerating voltage of 1 keV to 100 keV. The Ar ion implantation may be performed simultaneous with the third doping process. In this case, ions including Ar and P are simultaneously implanted at the same accelerating voltage.

Next, the resists are removed by oxygen plasma ashing. With respect to this method, the same method as used in the resist removal after the first doping process is used. In this case as well, since Ar is implanted, the resist can be easily ashed.

Figure 6A:
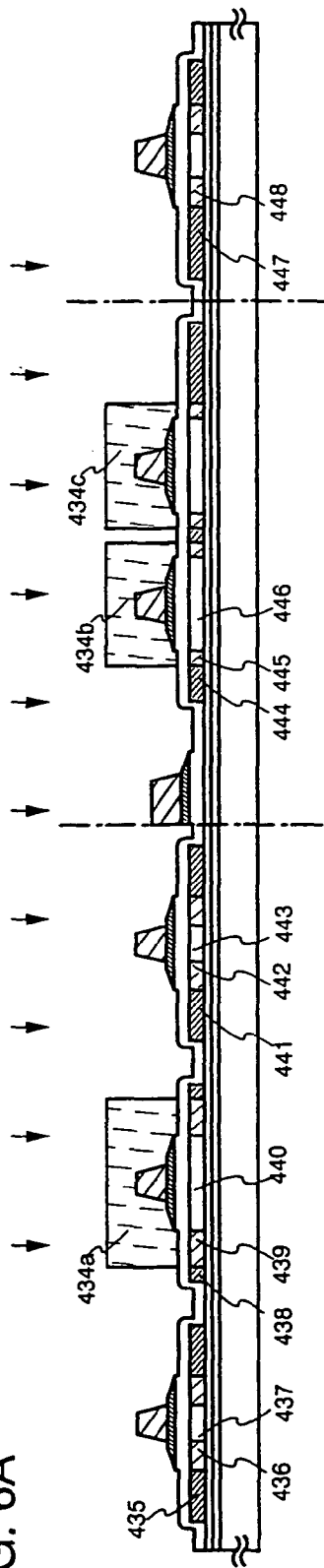
FIGS. 6A to 6C are cross sectional views for explaining steps of manufacturing the TFTs.
Figure 6B:
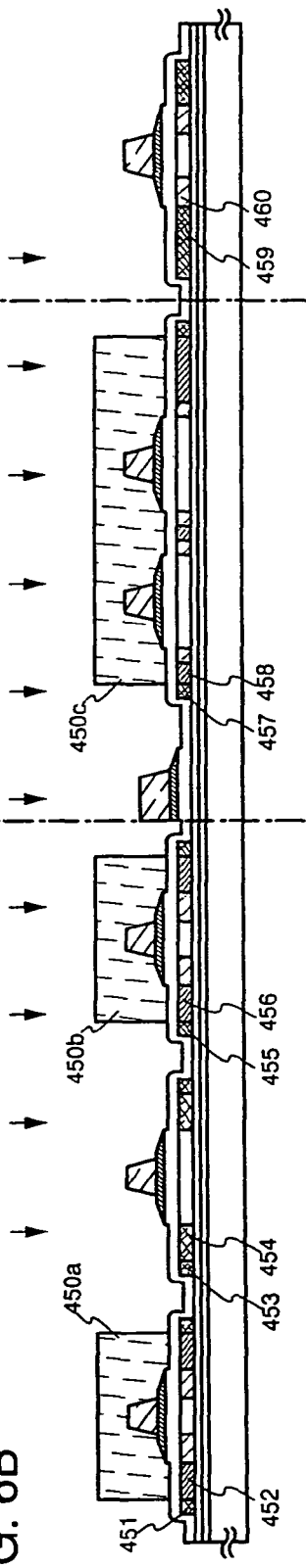

Next, new resist masks 450a to 450c are formed and fourth doping process is performed. By the fourth doping process, impurity regions 451, 453 to 455, 457, 459, and 460 to which an impurity element for imparting a conductivity type opposite to the conductivity type mentioned above is added are formed in the semiconductor layers that become active layers of p-channel TFTs. The impurity element for imparting the p-type is added using the second conductive layers 428b and 432b as masks against the impurity element to form impurity regions in a self-alignment manner. In this embodiment, the impurity regions 451, 453 to 455, 457, 459, and 460 are formed by an ion implantation method using diborane ($B_2H_6$) (FIG. 6B). In the fourth doping process, the semiconductor layers composing n-channel TFTs are partially covered with the resist masks 450a to 450c. Although P is added to the impurity regions 438 and 439 at different concentrations by the first through the third doping process, doping process is performed such that a concentration of the impurity element for imparting the p-type becomes $1 \times 10^{19}/cm^3$ to $5 \times 10^{21}/cm^3$ in any of the regions. Thus, since those impurity regions function as the source region and the drain region of the p-channel TFT, no problem is caused.

The impurity regions are formed in the respective semiconductor layers through the steps described hereinabove. The masks 450a to 450c made of resists are removed and a first interlayer insulating film 461 is formed. The first interlayer insulating film 461 is formed using an insulating film containing silicon at a thickness of 100 nm to 200 nm by a plasma CVD method or a sputtering method. In this embodiment, a silicon oxynitride film having a film thickness of 150 nm is formed by a plasma CVD method. Of course, the first interlayer insulating film 461 is not limited to the silicon oxynitride film and thus another insulating film containing silicon may be used as a single layer or a laminate structure.

Figure 6C:
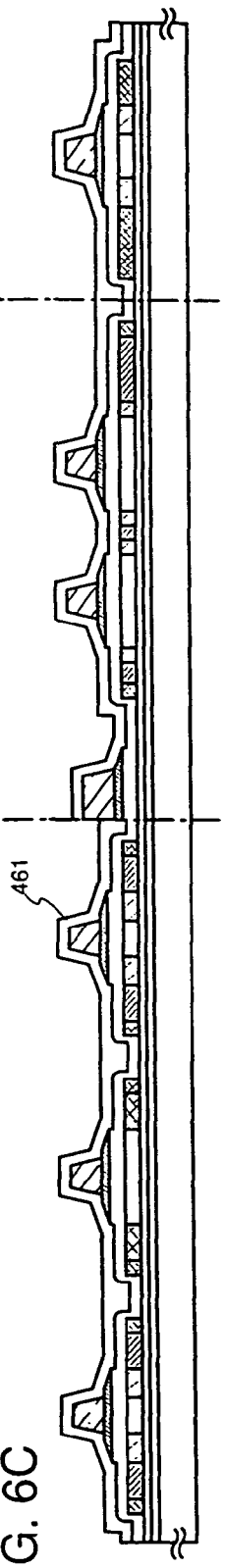

Next, as shown in FIG. 6C, recovery of crystallinity of the semiconductor layers and activation of the impurity elements added to the respective semiconductor layers are performed by thermal treatment. This thermal treatment is performed by a thermal anneal method using a furnace. The thermal anneal method is preferably performed in a nitrogen atmosphere at an oxygen concentration of 1 ppm or lower, preferably 0.1 ppm or lower and 400° C. to 700° C., typically 500° C. to 550° C. In this embodiment, the activation process is performed by thermal treatment at 550° C. for 4 hours. Note that a laser anneal method or a rapid thermal anneal method (RTA method) can be applied in addition to the thermal anneal method.

Next, a second interlayer insulating film 462 made of an inorganic insulating material or an organic insulating material is formed on the first interlayer insulating film 461. In this embodiment, an acrylic resin film having a film thickness of 1.6 μm is formed. Here, a film having a viscosity of 10 cp to 1000 cp, preferably 40 cp to 200 cp, and having an uneven surface is used.

In this embodiment, in order to prevent mirror reflection, the second insulating film 462 having an uneven surface is formed. Thus, the surface of the pixel electrode becomes uneven. Also, in order to provide unevennesses in the surface of the pixel electrode and thus to improve a light scattering property, a convex portion may be formed in a region under the pixel electrode. In this case, since the convex portions can be formed using the same photo mask as used in the formation of the TFT, they can be formed without increasing the number of steps. Note that the convex portions are preferably provided as appropriate on the substrate in a pixel portion region except for wirings and TFT portions. Thus, the unevennesses are formed in the surface of the pixel electrode along the unevennesses produced in the surface of the insulating film covering the convex portion.

A film having a flat surface may be used as the second interlayer insulating film 462. In this case, it is desirable that the unevennesses are produced in the surface by adding a step of performing a known sandblast method, a known etching method, or the like after the pixel electrode is formed, so that mirror reflection is prevented and whiteness is increased by scattering reflected light.

Figure 7:
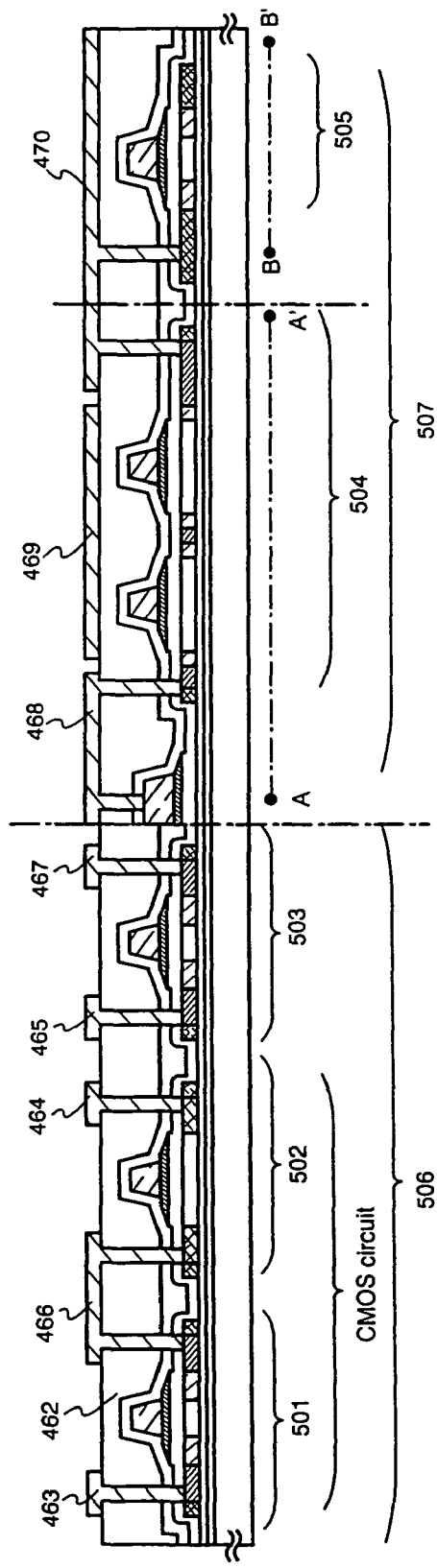
FIG. 7 is a cross sectional view for explaining steps of manufacturing the TFTs.

Then, wirings 463 to 468 electrically connected with the respective impurity regions are formed in a driver circuit 506. Note that those wirings are formed by patterning a laminate film composed of a Ti film having a film thickness of 50 nm and an alloy film (alloy film of Al and Ti) having a film thickness of 500 nm (FIG. 7).

Also, a pixel electrode 470, a gate wiring 469, and a connection electrode 468 are formed in a pixel portion 507. A source wiring 433 (laminate of a layer 433a and a layer 433b) is electrically connected with a pixel TFT through the connection electrode 468. The gate wiring 469 is electrically connected with the gate electrode of a pixel TFT 504. The pixel electrode 470 is electrically connected with a drain region 442 of the pixel TFT 504 and a semiconductor layer 458 which serves as one electrode composing a storage capacitor. It is desirable that a material having superior reflectance such as a film containing mainly Al or Ag or a laminate film thereof is used for the pixel electrode 470.

Thus, the driver circuit 506 including a CMOS circuit composed of an n-channel TFT 501 and a p-channel TFT 502 and an n-channel TFT 503, and the pixel portion 507 including the pixel TFT 504 and a storage capacitor 505 can be formed on the same substrate. Thus, the active matrix substrate is completed.

The n-channel TFT 501 in the driver circuit 506 includes a channel forming region 437, the low concentration impurity regions 436 (GOLD regions) overlapped with a first conductive layer 428a composing a portion of the gate electrode, high concentration impurity regions 452 which each serve as the source region or the drain region, and the impurity regions 451 into which an impurity element for imparting an n-type and an impurity element for imparting a p-type are introduced. The p-channel TFT 502 which is connected with the n-channel TFT 501 through an electrode 466 and composes the CMOS circuit includes a channel forming region 440, high concentration impurity regions 454 which each serve as the source region or the drain region, and the impurity regions 453 into which an impurity element for imparting an n-type and an impurity element for imparting a p-type are introduced. Also, the n-channel TFT 503 includes a channel forming region 443, the low concentration impurity regions 442 (GOLD regions) overlapped with a first conductive layer 430a composing a portion of the gate electrode, high concentration impurity regions 456 which each serve as the source region or the drain region, and the impurity regions 455 into which an impurity element for imparting an n-type and an impurity element for imparting a p-type are introduced.

The pixel TFT 504 in the pixel portion includes a channel forming region 446, low concentration impurity regions 445 (LDD regions) formed outside the gate electrode, high concentration impurity regions 458 which each serve as the source region or the drain region, and the impurity regions 457 into which an impurity element for imparting an n-type and an impurity element for imparting a p-type are introduced. Also, an impurity element for imparting an n-type and an impurity element for imparting a p-type are added to the semiconductor layer which serve as one electrode of the storage capacitor 505. The storage capacitor 505 is composed of an electrode (laminate of the layer 432a and the layer 432b) and the semiconductor layer, with the insulating film 416 as dielectric.

According to a pixel structure of this embodiment, in order to light-shield a gap between pixel electrodes without using a black matrix, the pixel electrode is formed and disposed such that end portions thereof are overlapped with the source wiring.

Figure 8:
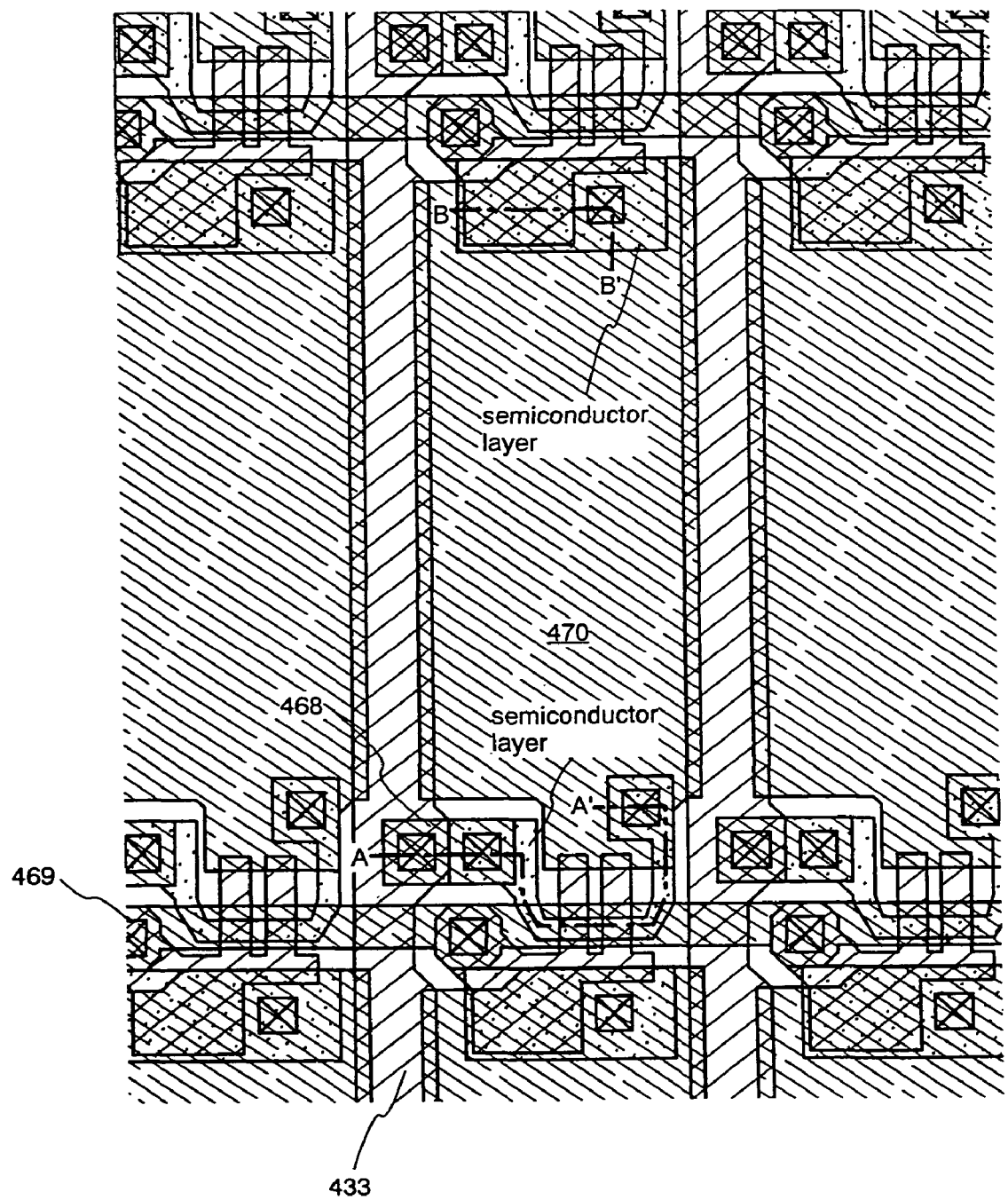
FIG. 8 a top view for explaining structures of the TFTs in a pixel portion.

FIG. 8 is a top view of a pixel portion of the active matrix substrate manufactured in this embodiment. Note that the same reference symbols are used for portions corresponding to those in FIGS. 5A to 8. A chain line A-A' in FIG. 7 corresponds to a cross sectional view obtained by cutting along a chain line A-A' in FIG. 8. Also, a chain line B-B' in FIG. 7 corresponds to a cross sectional view obtained by cutting along a chain line B-B' in FIG. 8.

Embodiment 2

Figure 9:
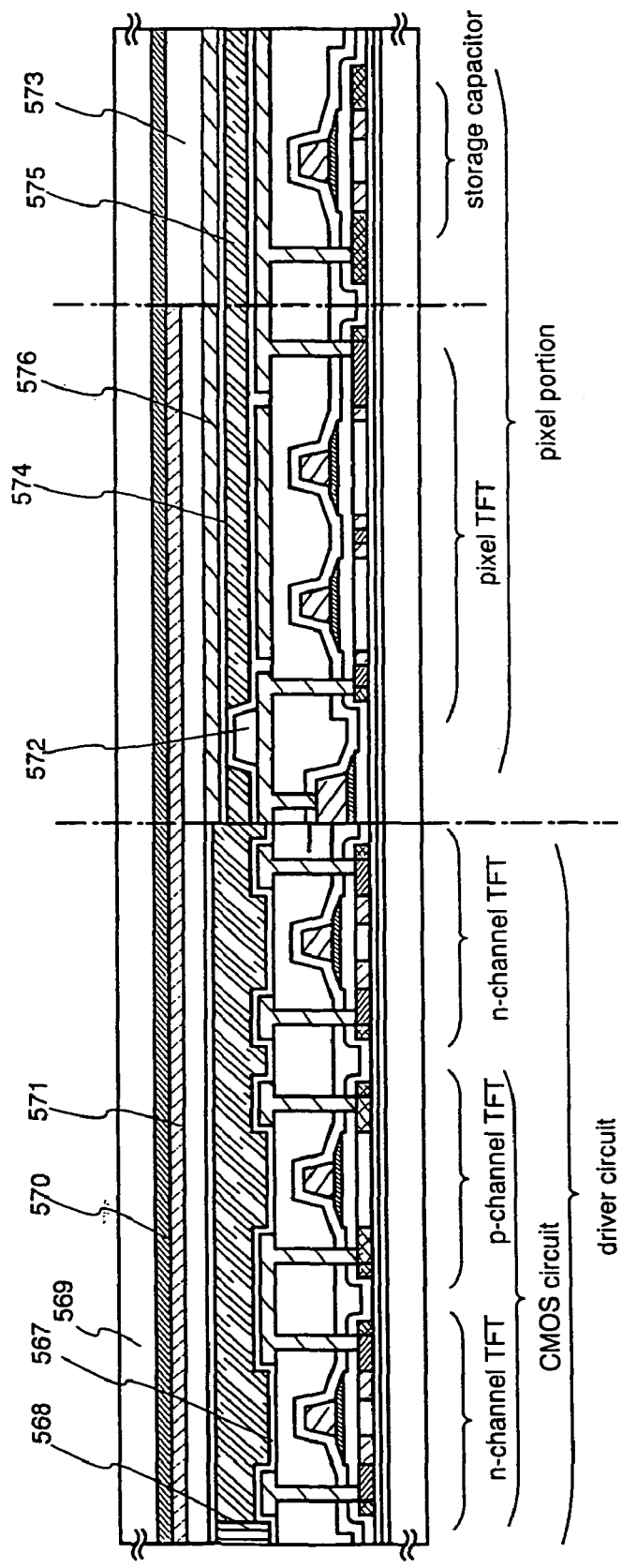
FIG. 9 is a cross sectional view for explaining a structure of a liquid crystal display device.

In this embodiment, an explanation will be given as follows of steps of manufacturing a reflection type liquid crystal display device from the active matrix substrate fabricated in Embodiment 1. FIG. 9 is used in the explanation.

First, in accordance with Embodiment 1, there is provided the active matrix substrate in the state of FIG. 7 and thereafter, an alignment film 567 is formed above the active matrix substrate of FIG. 7, at least above the pixel electrode 470 and a rubbing process is carried out. Further, in this embodiment, before forming the alignment film 567, by patterning an organic resin film such as an acrylic resin film, spacers in a columnar shape 572 are formed at desired positions in order to maintain an interval between substrates. Further, in place of the spacers in the columnar shape, spacers in a spherical shape may be scattered over an entire face of the substrate.

Next, an opposed substrate 569 is prepared. Successively, there are formed color layers 570 and 571 and a planarizing film 573. A light-shielding portion is formed by overlapping the color layer 570 of red color and the color layer 571 of blue color. Further, the light-shielding portion may be formed by overlapping portions of a color layer of red color and a color layer of green color.

In this embodiment, there is used the substrate shown in Embodiment 1. Therefore, in FIG. 8 showing the top view of the pixel portion of Embodiment 1, it is necessary to shield at least a clearance between the gate wiring 469 and the pixel electrode 470, a clearance between the gate wiring 469 and the connection electrode 468 and a clearance between the connection electrode 468 and the pixel electrode 470. In this embodiment, the respective color layers are arranged such that the light shielding portions constituted by laminating the color layers overlap positions to be shielded and the opposed substrate is pasted thereto.

A number of steps can be reduced by shielding the clearances among the respective pixels by the light shielding portions constituted by laminating the color layers in this way without forming light shielding layers such as black masks.

Next, the opposed electrode 576 constituted by a transparent conductive film is formed on the planarizing film 573 at least at the pixel portion, an alignment film 574 is formed over an entire face of the opposed substrate and the rubbing process is carried out.

Further, the active matrix substrate formed with the pixel portion and the driver circuit and the opposed substrate are pasted together by a seal member 568. The seal member 568 is mixed with a filler and two sheets of the substrates are pasted together at a uniform interval therebetween by the filler and the spacers in the columnar shape. Thereafter, the interval between the two substrates is injected with a liquid crystal material 575 and is completely sealed by a seal agent (not illustrated). A publicly known liquid crystal material may be used for the liquid crystal material 575. In this way, the reflection type liquid crystal display apparatus shown in FIG. 9 is finished. Further, as necessary, the active matrix substrate or the opposed substrate may be divided into a desired shape. Further, a polarizer (not illustrated) is pasted to only the opposed substrate. Further, FPC is pasted thereto by using publicly known technology.

The liquid crystal display panel manufactured by above-mentioned steps can be used to the display portion of various electric apparatuses. The following is an example of the apparatuses; the video camera, the digital camera, the projectors (rear type or front type), the head mounted display (goggle type display), the personal computer and the portable information terminal (mobile computers, portable telephones or electronic books).

Embodiment 3

In this embodiment, one example different from Embodiment 1, in which the present invention is applied to form an active matrix substrate will be described using FIG. 13A to FIG. 17.

As a substrate 1000, a quartz substrate, a glass substrate, a ceramic substrate, or the like can be used. Also, a substrate obtained by forming an insulating film on the surface of a silicon substrate, a metallic substrate or a stainless steel substrate may be used. Note that, when the glass substrate is used, thermal treatment may be performed in advance at a temperature which is 10° C. to 20° C. lower than a glass distortion point.

A polysilicon film and a WSi film are formed on the substrate 1000 and patterned to form a lower portion light-shielding film 1001. A polysilicon film, a $WSi_x$ (X=2.0 to 2.8) film, a film made of a conductive material such as Al, Ta, W, Cr, or Mo, or a laminate structure thereof can be used for the lower portion light-shielding film 1001. In this embodiment, the lower portion light-shielding film 1001 which has a laminate structure of a $WSi_x$ film (film thickness: 100 nm) 1001b and a polysilicon film (film thickness: 50 nm) 1001a and is made of a conductive material with good light-shielding property is formed. Plural lower portion light-shielding films are formed at predetermined intervals. Note that, since the lower portion light-shielding film 1001 functions as a gate line, hereinafter, a portion corresponding to the lower portion light-shielding film is called the gate line.

Figure 13A:
FIGS. 13A to 13D are cross sectional views for explaining steps of manufacturing TFTs.

A first insulating film 1002 is formed so as to cover the gate line 1001. The first insulating film 1002 has a film thickness of about 100 nm. An insulating film containing silicon and formed by a plasma CVD method, a sputtering method, or the like is used as the first insulating film 1002. Also, the first insulating film 1002 may be formed of a silicon oxide film, a silicon oxynitride film, a silicon nitride film, or a laminate film of a combination thereof (FIG. 13A).

Next, an amorphous semiconductor film is formed on the first insulating film 1002 by a low pressure CVD method. A material of the amorphous semiconductor film is not particularly limited but it is preferably made of silicon, a silicon germanium ($Si_xGe_{1-x}$: 0<x<1, typically, x=0.001 to 0.05) alloy, or the like. Note that in this embodiment, an amorphous silicon film 1003 having a thickness of 65 nm is formed as the amorphous semiconductor film.

Figure 13B:
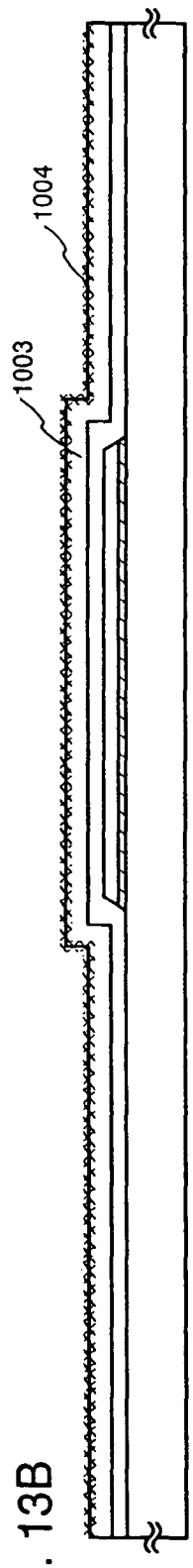

Next, the amorphous silicon film 1003 is crystallized to form a crystalline silicon film 1004 (FIG. 13B). As the crystallization method, a known method using laser light irradiation or a known method using thermal treatment may be used or a method of adding a catalytic element and performing thermal treatment may be used.

Note that, laser irradiation may be performed for the crystalline silicon film after the crystallization step to improve crystallinity of the crystalline silicon film. Subsequently, the crystalline silicon film is patterned to form semiconductor layers 1005 to 1008 having a first configuration.

Figure 13C:
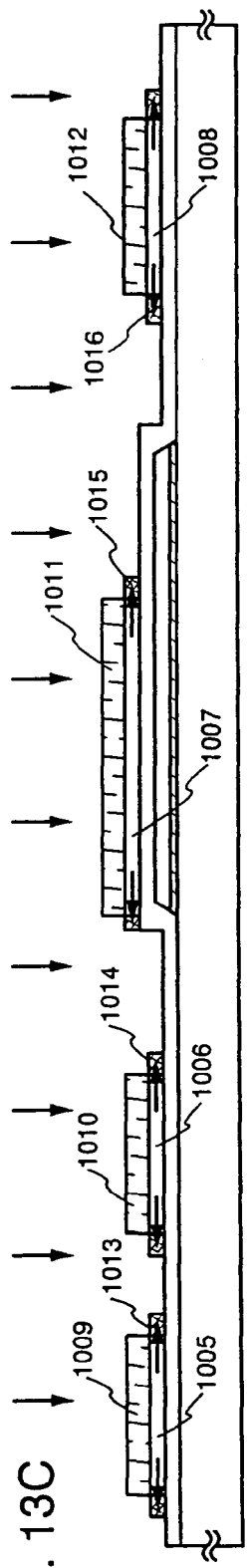

In the case where the crystallization is made using a catalytic element, resist masks 1009 to 1012 are then formed on the semiconductor layers 1005 to 1008 having a first configuration and regions 1013 to 1016 to which a rare gas element (typically, Ar) is selectively added (which are also called gettering regions) are formed. After that, a gettering step is performed (FIG. 13C). That is, thermal treatment is performed to move a catalytic element to the gettering regions 1013 to 1016. Thus, a concentration of the catalytic element included in a region which becomes the channel forming region of a TFT later is reduced.

Figure 13D:
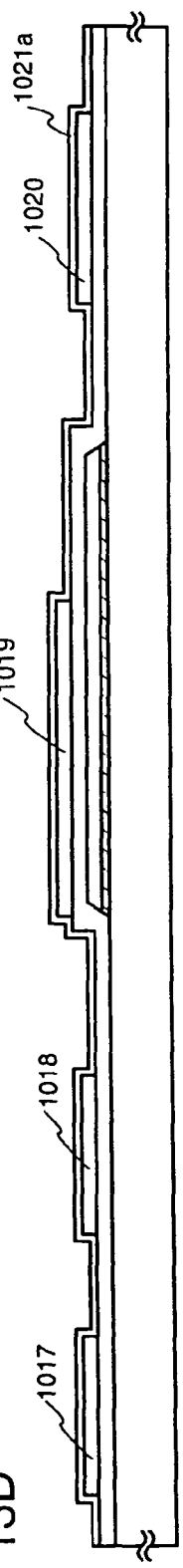

After the completion of the gettering step, the gettering regions 1013 to 1016 are removed and patterning is performed to form semiconductor layers 1017 to 1020 having a second configuration which become semiconductor layers of TFTs later (FIG. 13D). After that, the resist masks 1009 to 1012 are removed. At this time, since Ar is added to the resist masks 1009 to 1012, they can be easily removed.

Next, in order to improve the crystallinity of the semiconductor layers 1017 to 1020 having a second configuration, oxidation process is performed. A silicon oxide film having a thickness of 20 nm is formed by a low pressure CVD apparatus (not shown) and thermal oxidation process is performed at 950° C. to form a thermal oxide film (not shown) at a ratio of a silicon oxide film: portion in which the silicon oxide film is oxidized=20:60 nm. By this thermal oxidation process step, the film thickness of the semiconductor layers 1017 to 1020 having a second configuration becomes about 35 nm.

Figure 14A:
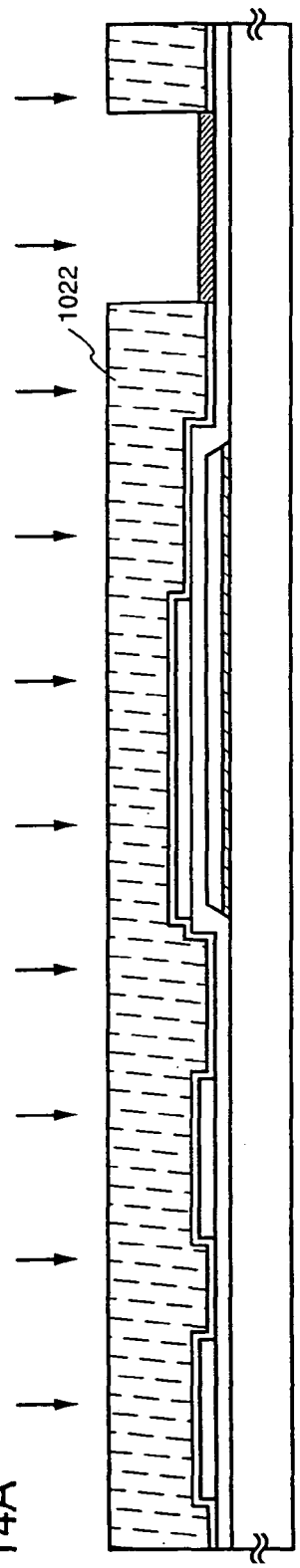
FIGS. 14A to 14C are cross sectional views for explaining steps of manufacturing the TFTs.
Figure 14B:
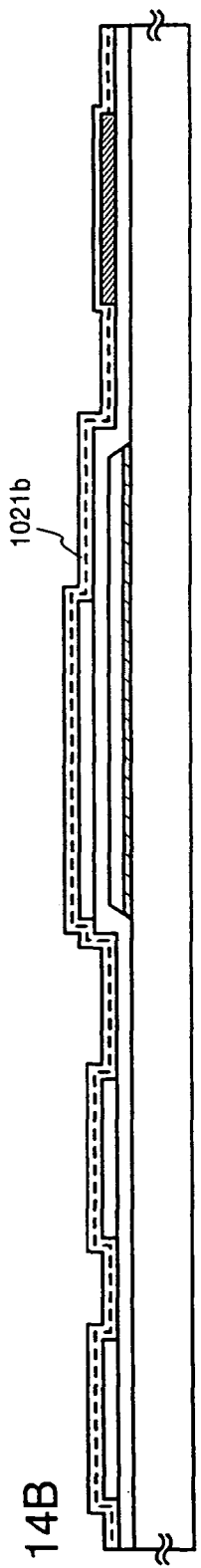

Next, a silicon oxide film having a thickness of 30 nm is formed as a second insulating film (gate insulating film) 1021a covering the semiconductor layers 1017 to 1020. Then, in order to use a region of the semiconductor layer 1020 which becomes a storage capacitor 1204 later as the lower electrode of the storage capacitor, a resist mask 1022 is formed for selectively etching the gate insulating film in a region just above the semiconductor layer 1020, and after the gate insulating film is removed and P is added, Ar is also added as a rare gas element (FIG. 14A). After that, the resist mask 1022 is removed and a silicon oxide film having a thickness of 50 nm is formed as a gate insulating film 1021b of a second layer (FIG. 14B). Also in this step, Ar is added after the addition of P. Thus, even if an altered layer is formed in the resist surface by the addition of P, the resist mask 1022 can be easily removed.

Note that after formation of the semiconductor layers 1017 to 1020, ion implantation of a minute impurity element (B or P) may be performed for controlling a threshold value of a TFT. The impurity addition step may be performed before the step of crystallizing the semiconductor film, after the step of crystallizing the semiconductor film, or after the step of forming the gate insulating films 1021a and 1021b.

Figure 14C:
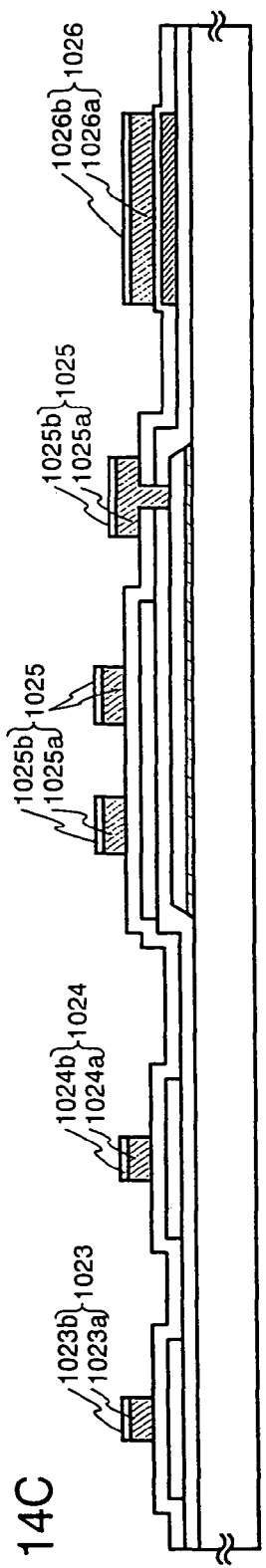

After that, the first insulating film 1002 and the gate insulating films 1021a and 1021b are selectively etched to form a contact hole which reaches the gate line 1001. Then, a conductive film is formed on the gate insulating film 1021b and patterned to thereby form gate electrodes 1023 to 1025 (1023a to 1025a, and 1023b to 1025b) and a capacitor wiring (upper electrode of the storage capacitor) 1026 (1026a and 1026b) on the channel forming regions of respective pixels. Since the gate insulating film formed in a region in which the capacitor wiring 1026 is formed is only the gate insulating film 1021b, it is made to be thinner than in other regions. Thus, an increase in a storage capacitance is attained. Also, the gate electrode 1025 is electrically connected with the gate line 1001 through the contact hole (FIG. 14C).

The conductive film for forming the gate electrodes and the capacitor wiring is formed of a polysilicon film or a $WSi_x$ film (x=2.0 to 2.8) to which an impurity element for imparting a conductivity type is added, or made of a conductive material such as Al, Ta, W, Cr, or Mo or a laminate structure thereof, with a film thickness of about 300 nm. However, a single layer of the above conductive material may also be used.

Figure 15A:
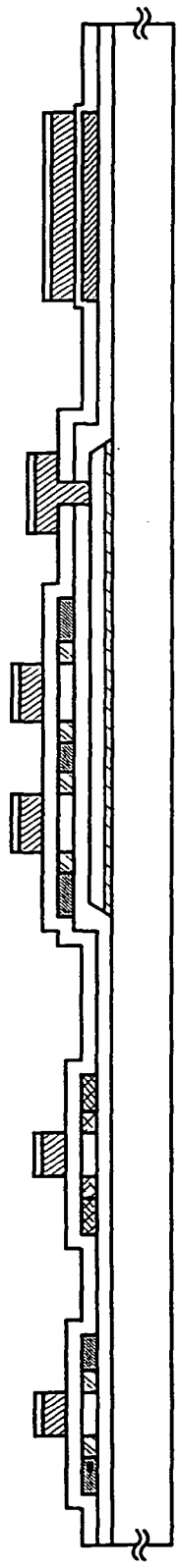
FIGS. 15A to 15C are cross sectional views for explaining steps of manufacturing the TFTs.

Next, in order to form TFTs using the semiconductor layers 1017 to 1020 as active layers, an impurity element for imparting an n-type or a p-type (hereinafter referred to as an n-type impurity element or a p-type impurity element) is selectively added to the semiconductor layers to form low resistance source regions, low resistance drain regions, and LDD regions (FIG. 15A). The impurity element is added to the LDD regions as in the source regions and the drain regions. Thus, the channel forming region sandwiched by the source region and the drain region is formed in each of the semiconductor layers 1017 to 1020. Therefore, the present invention can be applied even when ion implantation of an impurity element for imparting a conductivity type is performed using the resist masks to form regions as the LDD regions, the source regions, and the drain regions, and the resist masks can be easily removed by applying the present invention.

Figure 15B:
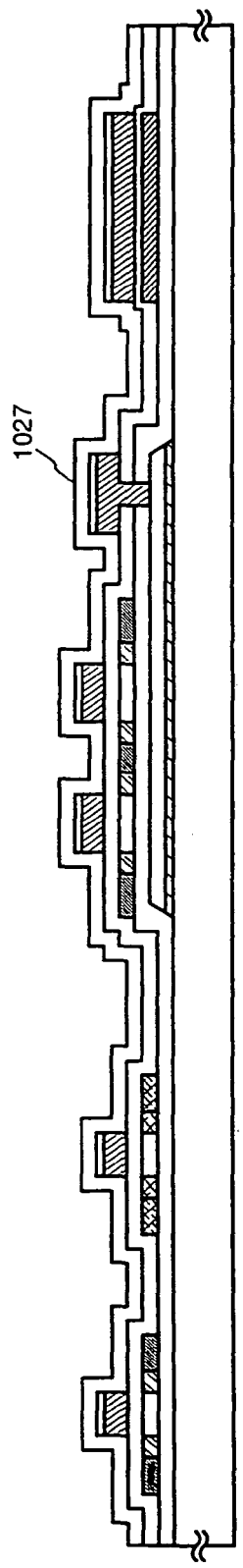

Next, a third insulating film (first interlayer insulating film) 1027 which covers the gate electrodes 1023 to 1025 and the capacitor wiring 1026 is formed (FIG. 15B). As the third insulating film 1027, a silicon oxide film, a silicon nitride film, a silicon oxynitride film, or a laminate film of a combination thereof is preferably formed at a thickness of about 70 nm.

Next, a fourth insulating film (second interlayer insulating film) 1028 is formed. As the fourth insulating film 1028, any one of an organic insulating material film, a silicon oxide film, a silicon nitride film, and a silicon oxynitride film may be formed at a thickness of 800 nm.

Figure 15C:
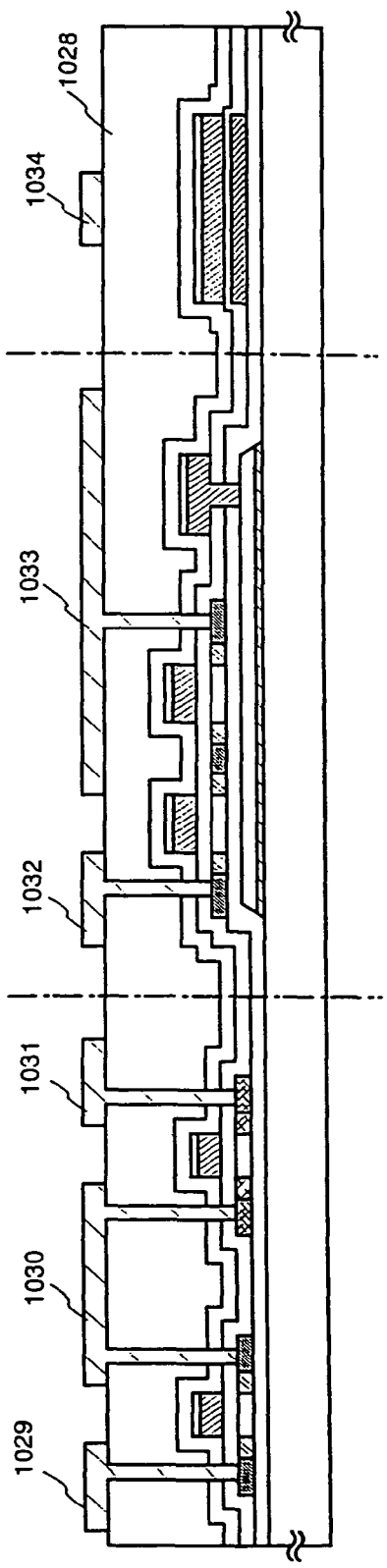

Next, contact holes which reach the semiconductor layers 1017 to 1020 are formed in the gate insulating film 1021, the third insulating film 1027, and the fourth insulating film 1028. Then, conductive films which are in contact with the semiconductor layers 1017 to 1020 through the contact holes are formed on the fourth insulating film 1028 and patterned to form connection wirings and source lines 1029 to 1034 for electrically connecting respective TFTs with each other (FIG. 15C). As regards the conductive films for forming these wirings, a film containing mainly Al, W, Ti, or TiN, or a conductive film having a laminate structure thereof (in this embodiment, a three-layer structure in which an Al film containing Ti is sandwiched by Ti films) is formed with a thickness of 500 nm and patterned. Note that the source line 1032 is electrically connected with the semiconductor layer 1020 through the upper portion of the storage capacitor.

Figure 16B:
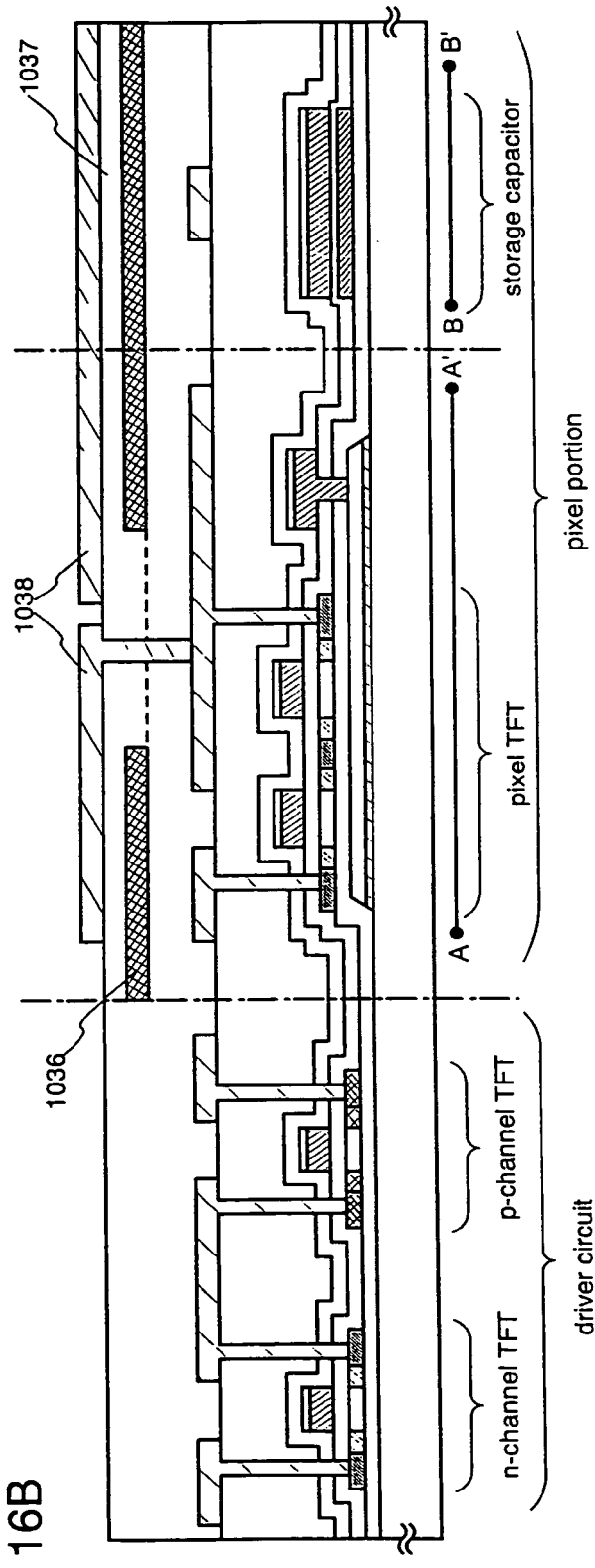
Figure 17:
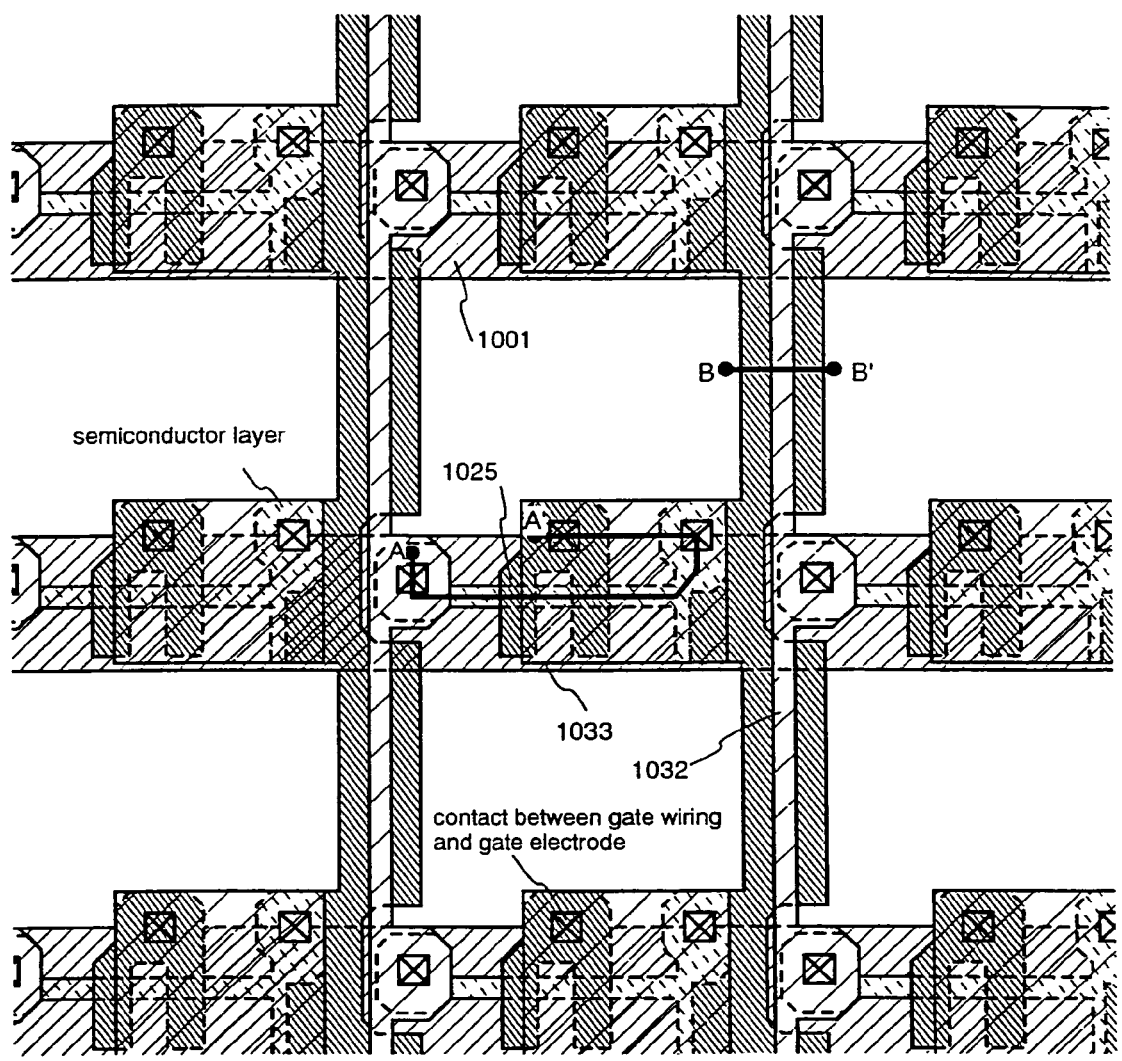
FIG. 17 is a top view for explaining structures of the TFTs in a pixel portion.

FIG. 17 is a top view indicating a state where the various formation processes described hereinabove have been performed. A schematic cross sectional view taken along a line A-A' in the drawing corresponds to a portion of a line A-A' in FIG. 16B and a schematic cross sectional view taken along a line B-B' corresponds to a portion of a line B-B' in FIG. 16B.

Figure 16A:
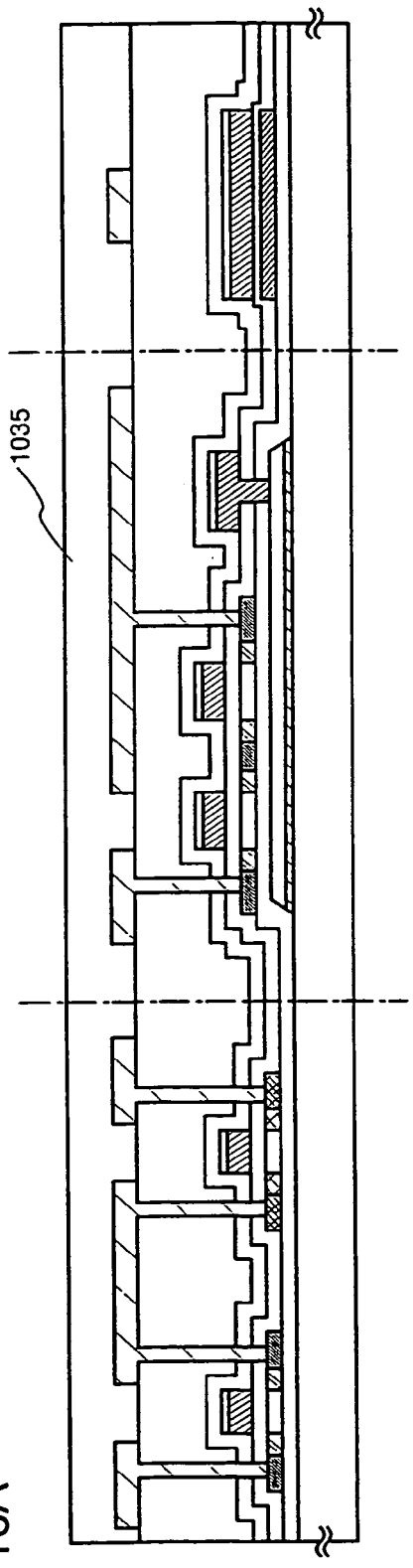
FIGS. 16A and 16B are cross sectional views for explaining steps of manufacturing the TFTs.

Next, an organic insulating film made of acrylic or the like is formed as a fifth insulating film 1035 covering the connection wirings at a thickness of 1000 nm (FIG. 16A). A film which is made of Al, Ti, W, Cr, a block color resin, or the like and has good light-shielding property is formed and patterned in a predetermined shape to form a light-shielding films 1036. The light-shielding films 1036 are formed in a mesh-like manner so as to light-shield regions except for the openings of pixels. Further, a sixth insulating film 1037 made of the same material as the fifth insulating film 1035 is formed so as to cover the light-shielding film 1036. A contact hole which reaches the connection wiring 1033 are formed in the fifth insulating film 1035 and the sixth insulating film 1037.

Next, a transparent conductive film made of ITO or the like is formed at a thickness of 100 nm and patterned in a predetermined shape to form pixel electrodes 1038 (FIG. 16B).

An alignment film for orienting a liquid crystal layer is formed in the thus formed active matrix substrate. Using a known cell constructing technique, a counter substrate on which a counter electrode and an alignment film are formed and the active matrix substrate are boned to each other, liquid crystal is injected therebetween, and then sealing is performed. Thus, an active matrix liquid crystal display device can be completed. The thus manufactured liquid crystal display panel can be used as a display portion of various electric appliances such as a video camera, a digital camera, a projector (rear type or front type), a head mounted display (goggle display), a personal computer, and a personal digital assistant (mobile computer, portable telephone, electronic book, or the like).

Embodiment 4

The light emitting device, which operates by an active matrix driving, can be formed in accordance with the same step of manufacturing an active matrix substrate shown in Embodiment 1. In this embodiment, one form of the light emitting device is explained. In this specification, the light emitting device refers, generally, to the display panel having light emitting elements formed on a substrate sealed between the substrate and a cover member, and the display module having an IC mounted on the display panel. Incidentally, the light emitting element has a layer including an organic compound that electro-luminescence caused is obtained by applying an electric field (light emitting layer), an anode layer and a cathode layer. Meanwhile, the electro-luminescence in organic compound includes the light emission (fluorescent light) upon returning from the singlet-excited state to the ground state and the light emission (phosphorous light) upon returning from the triplet-excited state to the ground state, including any or both of light emission.

Figure 10:
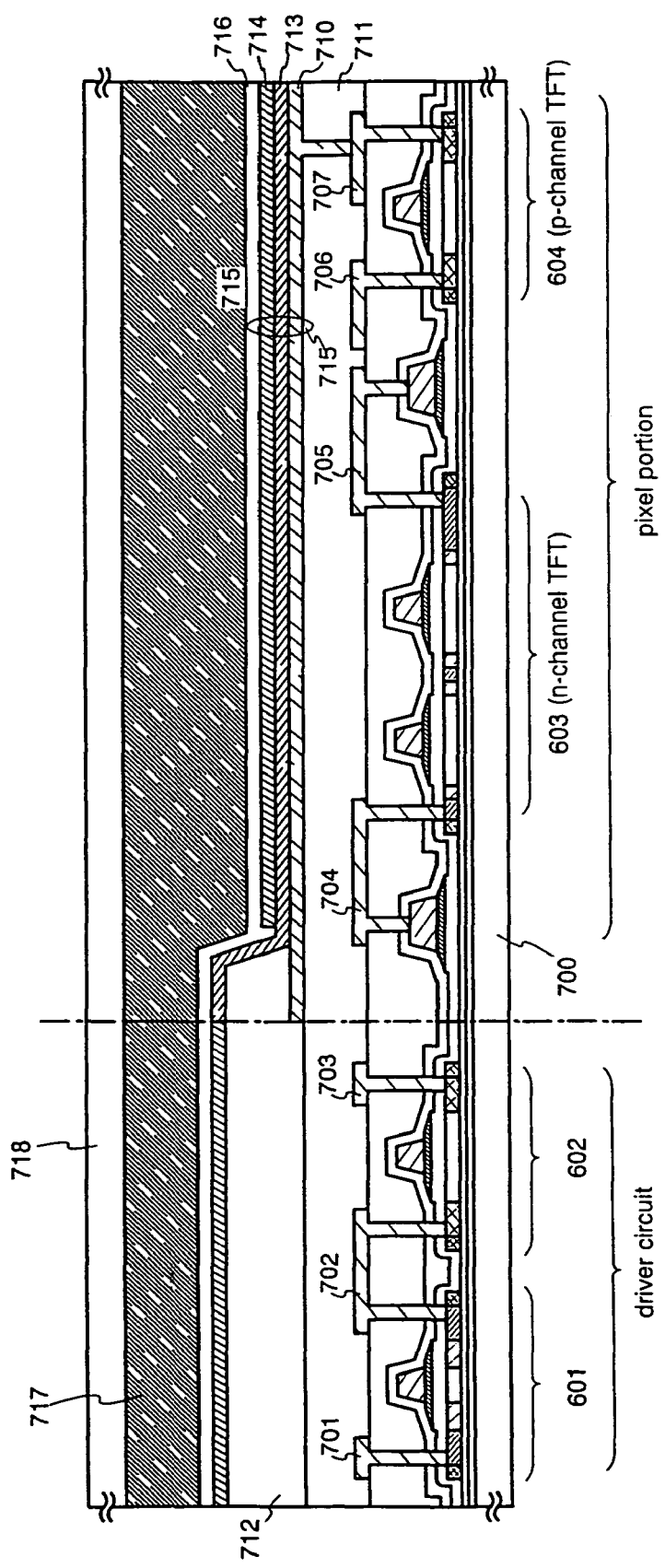
FIG. 10 is a cross sectional view for explaining a structure of a light emitting device.

FIG. 10 is a sectional view of a light emitting device of this embodiment. In FIG. 10, the switching TFT 603 provided on the substrate 700 is formed by using the n-channel TFT 503 of FIG. 7. Consequently, the step of manufacturing is according to Embodiment 1.

Incidentally, although this embodiment is of a double gate structure formed with two channel regions, it is possible to use a single gate structure formed with one channel region or a triple gate structure formed with three.

The driver circuit provided on the substrate 700 is formed by using the CMOS circuit of FIG. 10. Consequently, concerning the explanation of the structure, it is satisfactory to refer the explanation on the n-channel TFT 501 and p-channel TFT 502. Incidentally, although this embodiment is of a single gate structure, it is possible to use a double gate structure or a triple gate structure.

Meanwhile, the wirings 701, 703 serve as source wirings of the CMOS circuit while the wiring 702 as a drain wiring. Meanwhile, a wiring 704 serves as a wiring to electrically connect between the source wiring 708 and the source region of the switching TFT while the wiring 705 serves as a wiring to electrically connect between the drain wiring 709 and the drain region of the switching TFT.

Incidentally, a current control TFT 604 is formed by using the p-channel TFT 502 of FIG. 10. Consequently, concerning the explanation of the structure, it is satisfactory to refer to the explanation on the p-channel TFT 502. Incidentally, although this embodiment is of a single gate structure, it is possible to use a double gate structure or a triple gate structure.

Meanwhile, the wiring 706 is a source wiring of the current control TFT (corresponding to a current supply line) while the wiring 707 is an electrode to be electrically connected to the pixel electrode 710 by being overlaid a pixel electrode 710 of the current control TFT.

Meanwhile, 710 is a pixel electrode (anode of a light emitting element) formed by a transparent conductive film. As the transparent conductive film can be used a compound of indium oxide and tin oxide, a compound of indium oxide and zinc oxide, zinc oxide, tin oxide or indium oxide, or otherwise may be used a transparent conductive film as above added with gallium. The pixel electrode 710 is formed on a planar interlayer insulating film 711. In this embodiment, it is very important to planarize the step due to the TFT by using a resin planarizing film 711. A light emitting layer to be formed later, because being extremely small in thickness, possibly causes poor light emission due to the presence of a step. Accordingly, it is desired to provide planarization prior to forming a pixel electrode so that a light emitting layer can be formed as planar as possible.

After forming wirings 701 to 707, a bank 712 is formed as shown in FIG. 10. The bank 712 may be formed by patterning an insulating film or organic resin film containing silicon having 100 to 400 nm.

Incidentally, because the bank 712 is an insulating film, caution must be paid to electrostatic breakdown of element during deposition. In this embodiment added is a carbon particle or metallic particle to an insulating film as a material for the bank 712, thereby reducing resistivity and suppressing occurrence of static electricity. In such a case, the addition amount of carbon or metal particle may be adjusted to provide a resistivity of $1\times10^6$ to $1\times10^{12}$ Ωm (preferably $1\times10^8$ to $1\times10^{10}$ μm).

A light emitting layer 713 is formed on the pixel electrode 710. Incidentally, although FIG. 10 shows only one pixel, this embodiment separately forms light emitting layers correspondingly to the respective colors of R (red), G (green) and B (blue). Meanwhile, in this embodiment is formed a low molecular weight organic electro-luminescent material by the evaporation method. Specifically, this is a lamination structure having a copper phthalocyanine (CuPc) film provided in a thickness of 20 nm as a hole injecting layer and a tris-8-qyuinolinolato aluminum complex ($Alq_3$) film provided thereon in a thickness of 70 nm as a light emitting layer. The color of emission light can be controlled by adding a fluorescent pigment, such as quinacridone, perylene or DCM1, to $Alq_3$.

However, the foregoing example is an example of organic light emitting material to be used for a light emitting layer and not necessarily limited to this. It is satisfactory to form a light emitting layer (layer for light emission and carrier movement therefore) by freely combining a light emitting layer, a charge transporting layer and an electron injecting layer. For example, although in this embodiment was shown the example in which a low molecular weight organic electroluminescent material is used for a light emitting layer, it is possible to use a high molecular weight organic electro-luminescent material. Meanwhile, it is possible to use an inorganic material such as silicon carbide for an electron transporting layer or charge injecting layer. These organic light emitting materials or inorganic materials can be a known material.

Next, a cathode 714 of a conductive film is provided on the light emitting layer 713. In the case of this embodiment, as the conductive film is used an alloy film of aluminum and lithium. A known MgAg film (alloy film of magnesium and silver) may be used. As the cathode material may be used a conductive film of an element belonging to the periodic-table group 1 or 2, or a conductive film added with such an element.

A light emitting element 715 is completed at a time having formed up to the cathode 714. Incidentally, the light emitting element 715 herein refers to a diode formed with a pixel electrode (anode) 710, a light emitting layer 713 and a cathode 714.

It is effective to provide a passivation film 716 in such a manner to completely cover the light emitting element 715. The passivation film 716 is formed by an insulating film including a carbon film, a silicon nitride film or a silicon nitride oxide film, and used is an insulating film in a single layer or a combined lamination.

In such a case, it is preferred to use a film favorable in coverage as a passivation film. It is effective to use a carbon film, particularly DLC (diamond-like carbon) film. The DLC film, capable of being deposited in a temperature range of from room temperature to 100° C. or less, can be easily deposited over the light emitting layer 713 low in heat resistance. Meanwhile, the DLC film, having a high blocking effect to oxygen, can suppress the light emitting layer 713 from oxidizing. Consequently, prevented is the problem of oxidation in the light emitting layer 713 during the following seal process.

Furthermore, a seal member 717 is provided on the passivation film 716 to bond a cover member 718. For the seal member 717 used may be an ultraviolet-ray-set resin. It is effective to provide therein a substance having a hygroscopic effect or an antioxidant effect. Meanwhile, in this embodiment, for the cover member 718 used is a glass substrate, quartz substrate or plastic substrate (including a plastic film) having carbon films (preferably diamond-like carbon films) formed on the both surfaces thereof.

Thus, completed is a light emitting device having a structure as shown in FIG. 10. Incidentally, it is effective to continuously carry out, without release to the air, the process to form a passivation film 716 after forming a bank 712 by using a deposition apparatus of a multi-chamber scheme (or in-line scheme). In addition, with further development it is possible to continuously carry out the process up to bonding a cover member 718, without release to the air.

In this manner, n-channel TFTs 601, 602, a switching TFT (n-channel TFT) 603 and a current control TFT (n-channel TFT) 604 on the insulating member 501 based on a plastic substrate. The number of masks required in the manufacturing process so far is less than that of a general active matrix light emitting apparatus.

Namely, because the TFT manufacture process is greatly simplified, it is possible to realize yield improvement and manufacturing cost reduction.

Furthermore, as was explained using FIG. 10, by providing an impurity region overlapped with the gate electrode through an insulating film, it is possible to form an n-channel TFT resistive to the deterioration resulting from hot-carrier effect. Consequently, a reliable light emitting device can be realized.

Meanwhile, this embodiment shows only the configuration of the pixel portion and driver circuit. However, according to the manufacturing process in this embodiment, besides these, it is possible to form on the same insulating member such logic circuits as a signal division circuit, a D/A converter, an operation amplifier, a γ-correction circuit or the like. Furthermore, a memory or microprocessor can be formed.

Furthermore, explained is a light emitting device of this embodiment having done the process up to sealing (or encapsulation) for protecting the light emitting elements, using FIG. 11. Incidentally, the reference numerals used in FIG. 10 are cited as required.

Figure 11A:
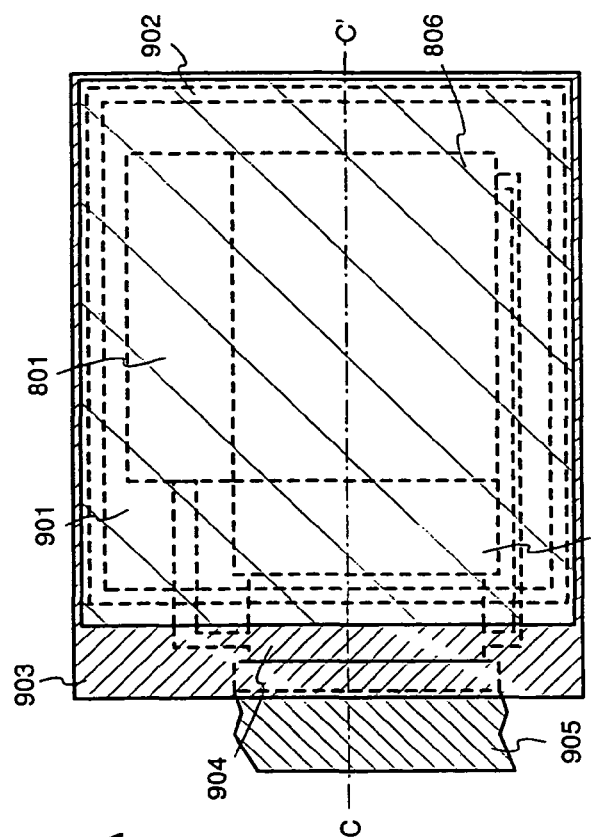
FIGS. 11A and 11B are a top view and a cross sectional view for explaining a structure of a light emitting device.
Figure 11B:
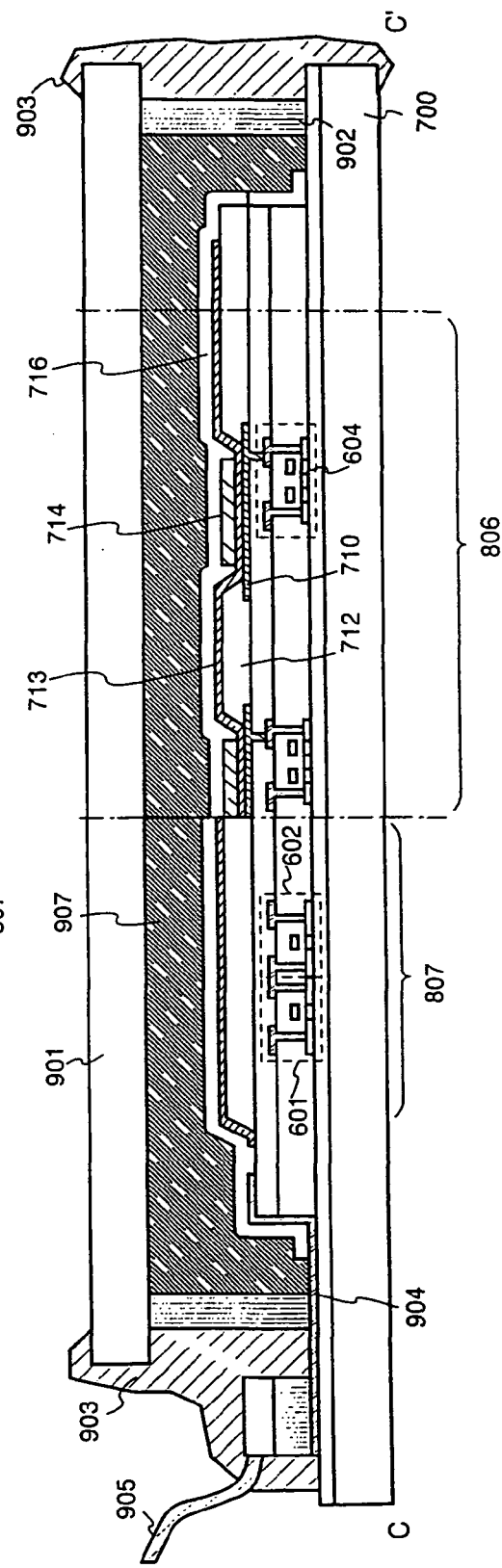

FIG. 11A is a top view showing a state done up to sealing of the light emitting elements while FIG. 11B is a sectional view taken on line C-C' in FIG. 11A. 801 designated by the dotted line is a source driver circuit, 806 a pixel region and 807 a gate driver circuit. In addition, 901 is a cover member, 902 a first seal member and 903 a second seal member. An encapsulation material 907 is provided at the inside surrounded by the seal member 902.

Incidentally, 904 is an wiring to transmit a signal to be inputted to a source driver circuit 801 and gate driver circuit 807, to receive a video signal or clock signal from an FPC (Flexible Print Circuit) 905 as an external input terminal. Incidentally, although only FPC is shown herein, the FPC may be attached with a printed wiring board (PWB). The light emitting device in this specification includes not only a light emitting device main body but also such a device in the state attached with an FPC or PWB.

Next, explanation is made on the sectional structure, by using FIG. 11B. The pixel region 806 and the gate driver circuit 807 are formed on the substrate 700. The pixel region 806 is formed with a plurality of pixels each including a current control TFT 604 and a pixel electrode 710 electrically connected to a drain thereof. Meanwhile, the gate driver circuit 807 is formed using a CMOS circuit having a combination of an n-channel TFT 601 and a p-channel TFT 602 (see FIG. 14).

The pixel electrode 710 serves as an anode of a light emitting element. Meanwhile, banks 712 are formed on the both ends of the pixel electrode 710. On the pixel electrode 710, a light emitting layer 713 and a cathode 714 of a light emitting element are formed.

The cathode 714 serves also as an wiring common to all the pixels and electrically connected to the FPC 905 by way of an connection wiring 904. Furthermore, all the elements included in the pixel region 806 and gate driver circuit 807 are covered by the cathode 714 and passivation film 716.

Meanwhile, a cover member 901 is bonded by the first seal member 902. Incidentally, a resin-film spacer may be provided in order to secure a spacing between the cover member 901 and the light emitting elements. An encapsulation material 907 is filled inside the first seal member 902. Incidentally, the first seal member 902 and encapsulation material 907 preferably uses epoxy resin. Meanwhile, the first seal member 902 is preferably of a material to transmit water and oxygen to a possible less extent. Furthermore, the encapsulation material 907 may contain a substance having a hygroscopic effect or an antioxidant effect.

The encapsulation material 907 covering the light emitting elements serves also as an adhesive to bond the cover member 901. Meanwhile, in this embodiment, as a material for the plastic substrate 901a forming the cover member 901 can be used, FRP (Fiberglass-Reinforced Plastics), PVF (polyvinyl Fluoride), Myler, polyester or acryl.

Meanwhile, after bonding the cover member 901 by using an encapsulation material 907, a second seal member 903 is provided so as to cover the side surface (exposed surface) of the encapsulation material 907. For the second seal member 903 can be used the same material as the first seal member 902.

With the above structure, by encapsulating the light emitting elements in the encapsulation material 907, the light emitting elements can be completely shielded from the outside. It is possible to prevent the intrusion, from the external, of the substance, such as water or oxygen, which accelerates the deterioration in the light emitting layer. Thus, a reliable light emitting device can be obtained.

When the present invention is used, the resist used as a mask at ion implantation is easily removed. Thus, a resist removal time can be shortened and remaining of the resist can be prevented.

What is claimed is:

1. A method for manufacturing a semiconductor device comprising:
   forming a plurality of semiconductor layers over a substrate;
   forming a gate insulating film on the plurality of the semiconductor layers;
   forming a gate electrode and a source wiring on the gate insulating film by a same etching step;
   forming a resist mask over a portion of the plurality of the semiconductor layers;
   introducing phosphorus and a rare gas element into a plurality of semiconductor layers in which the resist mask is not formed and into the resist mask;
   removing the resist mask; and
   forming an interlayer insulating film over the gate electrode and the source wiring.

2. A method for manufacturing a semiconductor device according to claim 1, wherein the rare gas element is at least one selected from the group consisting of helium, krypton, argon, and xenon.

3. A method for manufacturing a semiconductor device according to claim 1, wherein the semiconductor device is a light emitting device.

4. A method for manufacturing a semiconductor device according to claim 1, wherein the phosphorus and the rare gas element are introduced simultaneously.

5. A method for manufacturing a semiconductor device according to claim 1, wherein the rare gas element is introduced at a lower accelerating voltage than the phosphorus.

6. A method for manufacturing a semiconductor device comprising:
   forming a plurality of semiconductor layers over a substrate;
   forming a gate insulating film on the plurality of the semiconductor layers;
   forming a gate electrode and a source wiring on the gate insulating film by a same etching step;
   forming a resist mask over a portion of the plurality of the semiconductor layers;
   introducing phosphorus and a rare gas element into a plurality of semiconductor layers in which the resist mask is not formed and into the resist mask;
   removing the resist mask;
   forming an interlayer insulating film over the gate electrode and the source wiring; and
   forming a connection electrode over the interlayer insulating film for electrically connecting the source wiring and one of the plurality of semiconductor layers.

7. A method for manufacturing a semiconductor device according to claim 6, wherein the rare gas element is at least one selected from the group consisting of helium, krypton, argon, and xenon.

8. A method for manufacturing a semiconductor device according to claim 6, wherein the semiconductor device is a light emitting device.

9. A method for manufacturing a semiconductor device according to claim 6, wherein the phosphorus and the rare gas element are introduced simultaneously.

10. A method for manufacturing a semiconductor device according to claim 6, wherein the rare gas element is introduced at a lower accelerating voltage than the phosphorus.

11. A method for manufacturing a semiconductor device comprising:
    forming a plurality of semiconductor layers over a substrate;
    forming a gate insulating film on the plurality of the semiconductor layers;
    forming a gate electrode and a source wiring on the gate insulating film by a same etching step;
    forming a resist mask over a portion of the plurality of the semiconductor layers;
    introducing phosphorus and a rare gas element into a plurality of semiconductor layers in which the resist mask is not formed and into the resist mask;
    removing the resist mask by ashing which uses an oxygen plasma; and
    forming an interlayer insulating film over the gate electrode and the source wiring.

12. A method for manufacturing a semiconductor device according to claim 11, wherein the rare gas element is at least one selected from the group consisting of helium, krypton, argon, and xenon.

13. A method for manufacturing a semiconductor device according to claim 11, wherein the semiconductor device is a light emitting device.

14. A method for manufacturing a semiconductor device according to claim 11, wherein the phosphorus and the rare gas element are introduced simultaneously.

15. A method for manufacturing a semiconductor device according to claim 11, wherein the rare gas element is introduced at a lower accelerating voltage than the phosphorus.

16. A method for manufacturing a semiconductor device comprising:
    forming a plurality of semiconductor layers over a substrate;
    forming a gate insulating film on the plurality of the semiconductor layers;
    forming a gate electrode and a source wiring on the gate insulating film by a same etching step;
    forming a resist mask over a portion of the plurality of the semiconductor layers;
    introducing phosphorus and a rare gas element into a plurality of semiconductor layers in which the resist mask is not formed and into the resist mask;
    removing the resist mask by ashing which uses an oxygen plasma;
    forming an interlayer insulating film over the gate electrode and the source wiring; and forming a connection electrode over the interlayer insulating film for electrically connecting the source wiring and one of the plurality of semiconductor layers.

17. A method for manufacturing a semiconductor device according to claim 16, wherein the rare gas element is at least one selected from the group consisting of helium, krypton, argon, and xenon.

18. A method for manufacturing a semiconductor device according to claim 16, wherein the semiconductor device is a light emitting device.

19. A method for manufacturing a semiconductor device according to claim 16, wherein the phosphorus and the rare gas element are introduced simultaneously.

20. A method for manufacturing a semiconductor device according to claim 16, wherein the rare gas element is introduced at a lower accelerating voltage than the phosphorus.

* * * * *